US011802682B1

(12) United States Patent
Choy et al.

(10) Patent No.: US 11,802,682 B1
(45) Date of Patent: Oct. 31, 2023

(54) MODULAR ARTICULATING LIGHTING

(71) Applicant: Wangs Alliance Corporation, Port Washington, NY (US)

(72) Inventors: Wai Ho Choy, Mineola, NY (US); Wei Gao, Guangzhou (CN); Fei Zeng, Dongguan (CN)

(73) Assignee: Wangs Alliance Corporation, Port Washington, NY (US)

( * ) Notice: Subject to any disclaimer, the term of this patent is extended or adjusted under 35 U.S.C. 154(b) by 0 days.

(21) Appl. No.: 18/094,374

(22) Filed: Jan. 8, 2023

Related U.S. Application Data

(60) Provisional application No. 63/426,841, filed on Nov. 21, 2022, provisional application No. 63/401,813, filed on Aug. 29, 2022.

(51) Int. Cl.

| | |
|---|---|
| ***F21V 23/06*** | (2006.01) |
| ***F21V 23/04*** | (2006.01) |
| ***F21S 2/00*** | (2016.01) |
| ***F21S 8/04*** | (2006.01) |
| ***F21V 21/005*** | (2006.01) |

(Continued)

(52) U.S. Cl.
CPC .............. *F21V 21/30* (2013.01); *F21S 2/005* (2013.01); *F21S 8/04* (2013.01); *F21V 3/02* (2013.01); *F21V 21/005* (2013.01); *F21V 23/04* (2013.01); *F21V 23/06* (2013.01); *H05B 45/42* (2020.01); *F21Y 2115/10* (2016.08)

(58) Field of Classification Search
CPC ........ F21S 2/005; F21V 21/30; F21V 21/005; F21V 23/06; H05B 45/42
See application file for complete search history.

(56) References Cited

U.S. PATENT DOCUMENTS

| | | |
|---|---|---|
| 1,606,873 A | 11/1926 | Gamache et al. |
| 2,738,756 A | 3/1956 | Doane |

(Continued)

FOREIGN PATENT DOCUMENTS

| | | |
|---|---|---|
| CN | 201651985 | 11/2010 |
| CN | 203225915 | 10/2013 |

(Continued)

OTHER PUBLICATIONS

Collier Products, https://www.lumens.com/collier-led-pendant-chandelier-by-visual-comfort-modern-TECP431914.html, Modern Lighting by Lumens Light+Living, Jul. 2022.

(Continued)

*Primary Examiner* — William N Harris
(74) *Attorney, Agent, or Firm* — Weiss & Arons LLP

(57) ABSTRACT

Apparatus and methods for lighting. The apparatus may include a first jewel and a second jewel. The first jewel may support the second jewel by a first link. The first jewel may support the second jewel by a second link. The first link and second links may be configured for transmission of current between the first jewel and the second jewel. The first and second links may be the only attachments of the second jewel to the first jewel. The first jewel may be configured to selectively emit three different colors of light. The second jewel may be configured to selectively emit three different colors of light. The second jewel may be configured to selectively emit the three different colors of the first jewel. The selection may be performed by a user using a switch.

19 Claims, 20 Drawing Sheets

(51) Int. Cl.

| | |
|---|---|
| ***H05B 45/42*** | (2020.01) |
| ***F21Y 115/10*** | (2016.01) |
| ***F21V 21/30*** | (2006.01) |
| ***F21V 3/02*** | (2006.01) |

(56) References Cited

U.S. PATENT DOCUMENTS 3,104,064 A 9/1963 Bellek
3,263,918 A 8/1966 Beachler
3,629,682 A 12/1971 Boelter
4,141,117 A 2/1979 Van Gompel
4,153,149 A 5/1979 Weber
4,495,463 A 1/1985 Milkovic
4,596,449 A 6/1986 Iwata et al.
4,739,457 A 4/1988 Orr
5,417,400 A 5/1995 Arakawa
5,463,280 A * 10/1995 Johnson .................. F21K 9/232 362/800
5,513,085 A 4/1996 Bourne
5,584,568 A 12/1996 Corbasson et al.
5,890,918 A 4/1999 Hierzer
6,013,988 A 1/2000 Bucks et al.
6,084,476 A 7/2000 Hamanishi
6,092,914 A 7/2000 Esakoff et al.
6,147,458 A 11/2000 Bucks et al.
6,149,283 A 11/2000 Conway et al.
6,155,693 A 12/2000 Spiegel et al.
6,241,064 B1 6/2001 Hierzer
6,250,774 B1 6/2001 Begemann et al.
6,290,368 B1 9/2001 Lehrer
6,390,647 B1 5/2002 Shaefer
6,424,102 B1 7/2002 Holtslag
6,525,414 B2 2/2003 Shiraishi et al.
6,530,791 B1 3/2003 Hierzer
6,561,690 B2 5/2003 Balestriero et al.
6,586,890 B2 7/2003 Min et al.
6,641,283 B1 11/2003 Bohler
6,655,819 B2 12/2003 Loga et al.
6,756,663 B2 6/2004 Shiraishi et al.
6,788,011 B2 9/2004 Mueller et al.
6,806,659 B1 10/2004 Mueller et al.
6,866,401 B2 3/2005 Sommers et al.
6,874,910 B2 4/2005 Sugimoto et al.
7,015,825 B2 3/2006 Callahan
7,038,399 B2 5/2006 Lys et al.
7,084,353 B1 8/2006 Downes
7,109,668 B2 9/2006 Pogodayev et al.
7,163,313 B2 1/2007 Rosenberg
7,192,162 B2 3/2007 Tanaka et al.
7,204,608 B2 4/2007 Beeman et al.
7,233,115 B2 6/2007 Lys
7,256,554 B2 8/2007 Lys
7,262,559 B2 8/2007 Tripathi et al.
7,326,179 B1 2/2008 Cienfuegos
7,352,138 B2 4/2008 Lys et al.
7,358,679 B2 4/2008 Lys et al.
7,422,356 B2 9/2008 Hama et al.
7,445,365 B1 11/2008 Hsu
7,513,661 B2 4/2009 Hamada et al.
7,534,975 B1 5/2009 Sharrah et al.
7,547,113 B2 6/2009 Lee
7,549,766 B2 6/2009 Sharrah et al.
7,609,006 B2 10/2009 Gibboney
7,733,659 B2 6/2010 Snider et al.
7,737,643 B2 6/2010 Lys
7,802,902 B2 9/2010 Moss et al.
7,837,866 B2 11/2010 Burrows
7,847,486 B2 12/2010 Ng
7,872,259 B2 1/2011 Den et al.
7,874,717 B1 1/2011 Shaefer
7,940,191 B2 5/2011 Hierzer
8,070,328 B1 12/2011 Knoble et al.
8,096,674 B2 1/2012 Matthews et al.
8,148,912 B2 4/2012 Kim
8,152,327 B2 4/2012 Brands et al.
8,162,502 B1 4/2012 Zadro
8,220,970 B1 7/2012 Khazi et al.
8,235,539 B2 8/2012 Thomas et al.
8,272,757 B1 * 9/2012 Fan .................... H01L 25/0753 362/800
8,371,710 B2 2/2013 Gupta et al.
8,482,226 B2 7/2013 Vinther et al.
8,575,641 B2 11/2013 Zimmerman et al.
8,598,793 B2 12/2013 Yan et al.
8,632,196 B2 1/2014 Tong et al.
8,651,704 B1 2/2014 Gordin et al.
8,662,709 B2 3/2014 Chang
8,704,262 B2 4/2014 Livesay et al.
8,708,535 B2 4/2014 Dalsgaard
8,773,024 B2 7/2014 Yan et al.
8,810,141 B2 8/2014 Takeda et al.
8,882,284 B2 11/2014 Tong et al.
8,905,587 B1 12/2014 Bouckaert
8,926,121 B2 1/2015 Wu
8,926,145 B2 1/2015 Lynch et al.
8,931,933 B2 1/2015 Tong et al.
9,028,086 B2 5/2015 Woo et al.
9,039,230 B2 5/2015 Crimi et al.
9,062,830 B2 6/2015 Le et al.
9,062,854 B2 6/2015 Livesay et al.
9,115,857 B2 8/2015 Beausoleil
9,140,414 B1 9/2015 Beausoleil
9,140,431 B1 9/2015 Lee
9,157,591 B2 10/2015 Rozot et al.
9,175,814 B2 11/2015 Shida et al.
9,204,519 B2 12/2015 Gan et al.
9,206,964 B2 12/2015 Marsh et al.
9,207,484 B2 12/2015 Hendren et al.
9,210,773 B1 12/2015 Sargent et al.
9,234,655 B2 1/2016 Progl et al.
9,247,597 B2 1/2016 Miskin et al.
9,282,427 B2 3/2016 Hill et al.
9,306,139 B2 4/2016 Lee et al.
9,310,038 B2 4/2016 Athalye
9,316,379 B2 4/2016 Beausoleil
9,420,644 B1 8/2016 Shum
9,494,299 B2 11/2016 Chang
9,500,325 B2 11/2016 Tong et al.
9,544,967 B2 1/2017 Recker et al.
9,598,575 B2 3/2017 Bhagwagar et al.
9,599,292 B2 3/2017 Jagt et al.
9,609,711 B2 3/2017 Jiang et al.
9,681,512 B1 6/2017 Xiong
9,726,339 B2 8/2017 Hierzer
9,730,282 B2 8/2017 Munday et al.
9,739,440 B1 8/2017 Deyaf et al.
9,739,472 B1 8/2017 Li
9,777,915 B2 10/2017 Johnson
9,784,440 B2 10/2017 Erdener et al.
9,863,622 B1 1/2018 Armer et al.
9,911,589 B2 3/2018 Goscha et al.
9,927,071 B2 3/2018 Jiang
9,951,915 B2 4/2018 Hierzer
9,989,228 B2 6/2018 Tuchler
10,041,635 B2 8/2018 Lame et al.
10,094,547 B2 10/2018 Hierzer
10,139,060 B1 11/2018 Erdener et al.
10,143,048 B2 11/2018 Hierzer
10,154,551 B2 * 12/2018 Miskin ................ H05B 45/305
10,161,609 B2 12/2018 Tuchler
10,180,218 B2 1/2019 Hierzer
10,186,820 B1 1/2019 Gellert et al.
10,190,757 B2 1/2019 Erdener et al.
10,208,935 B2 2/2019 Erdener
10,222,013 B2 3/2019 Hierzer
10,263,375 B1 4/2019 Gellert et al.
10,295,161 B1 5/2019 Shih
10,299,321 B1 5/2019 Trask et al.
10,323,822 B2 6/2019 Hierzer
10,323,832 B2 6/2019 Erdener et al.
10,323,837 B2 6/2019 Hierzer
10,330,269 B2 6/2019 Hierzer
10,330,294 B2 6/2019 Erdener
10,337,699 B2 7/2019 Hierzer

(56) References Cited

U.S. PATENT DOCUMENTS 10,337,701 B2 7/2019 Mastenbroek et al.
10,359,151 B2 7/2019 Tarsa et al.
10,378,747 B1 8/2019 Hanslip
10,436,422 B1 10/2019 Takacs et al.
10,461,483 B2 10/2019 Gellert et al.
10,465,888 B1 11/2019 Erdener et al.
10,480,770 B2 11/2019 Hierzer
10,571,101 B2 2/2020 Erdener et al.
10,598,358 B2 3/2020 Erdener et al.
10,665,762 B2 5/2020 Tong et al.
10,670,238 B2 6/2020 Shih
10,670,240 B2 6/2020 Shih
10,770,850 B2 9/2020 Gellert et al.
10,883,712 B2 1/2021 Chen et al.
10,920,971 B2 2/2021 Erdener et al.
10,941,930 B2 3/2021 Hatch et al.
10,969,088 B1 4/2021 Erdener et al.
11,486,553 B1 11/2022 Lavin et al.
2003/0063461 A1 4/2003 Tant
2003/0179585 A1 9/2003 Lefebvre
2004/0156189 A1 8/2004 Opolka
2004/0163797 A1 8/2004 Cosley et al.
2005/0007777 A1 1/2005 Klipstein et al.
2006/0262542 A1 11/2006 Ibbitson et al.
2007/0076415 A1 4/2007 Chou et al.
2007/0019415 A1 6/2007 Leblanc et al.
2007/0139913 A1 6/2007 Savage
2007/0222399 A1 9/2007 Bondy et al.
2007/0273299 A1* 11/2007 Miskin .................. H05B 45/39 315/250
2008/0080187 A1 4/2008 Purinton
2008/0094828 A1* 4/2008 Shao ......................... F21S 4/20 362/219
2008/0123340 A1 5/2008 McClellan
2008/0273331 A1 11/2008 Moss et al.
2009/0021185 A1 1/2009 Ng
2009/0067172 A1 3/2009 Inoue et al.
2009/0073696 A1 3/2009 Melzner
2009/0079712 A1 3/2009 Levin et al.
2009/0205935 A1 8/2009 Frick
2009/0206762 A1 8/2009 Gibboney
2009/0213621 A1 8/2009 Hierzer
2010/0036260 A1 2/2010 Zuluaga
2010/0102751 A1 4/2010 Markel
2010/0127626 A1 5/2010 Altonen et al.
2010/0208371 A1 8/2010 Chao
2010/0226139 A1 9/2010 Lynch et al.
2010/0259200 A1 10/2010 Beausoleil
2010/0271804 A1* 10/2010 Levine ...................... F21S 4/20 362/217.17
2010/0284192 A1 11/2010 Chen
2011/0037407 A1 2/2011 Ahn et al.
2011/0080741 A1 4/2011 Noh
2011/0115399 A1 5/2011 Sadwick et al.
2011/0121752 A1 5/2011 Newman, Jr. et al.
2011/0193488 A1 8/2011 Kanamori et al.
2011/0204777 A1 8/2011 Lenk
2012/0025717 A1 2/2012 Klusmann et al.
2012/0056559 A1 3/2012 Fu
2012/0069562 A1 3/2012 Singer et al.
2012/0139426 A1 6/2012 Ilyes et al.
2012/0153833 A1 6/2012 Mikani
2012/0206927 A1 8/2012 Miyahara
2012/0235582 A1 9/2012 Ido
2012/0243213 A1 9/2012 Chen
2013/0039055 A1 2/2013 Wilson et al.
2013/0063035 A1 3/2013 Baddela
2013/0088152 A1 4/2013 Hagen
2013/0114253 A1 5/2013 Segawa et al.
2013/0127356 A1 5/2013 Tanaka et al.
2013/0201671 A1 8/2013 Marcus et al.
2013/0208489 A1 8/2013 Schmuckle
2013/0221872 A1 8/2013 Gan et al.
2013/0248163 A1 9/2013 Bhagwagar et al.
2013/0249437 A1 9/2013 Wang et al.
2014/0015406 A1 1/2014 Fujiwara
2014/0049967 A1 2/2014 Erdener et al.
2014/0119022 A1 5/2014 Beausoleil
2014/0133149 A1* 5/2014 Catalano ............... F21V 21/005 362/238
2014/0160736 A1 6/2014 Chung et al.
2014/0300285 A1 10/2014 Medak
2014/0334157 A1 11/2014 Ferguson
2014/0361697 A1 12/2014 Miskin et al.
2014/0362566 A1 12/2014 Tischler et al.
2014/0375203 A1 12/2014 Goscha et al.
2015/0022114 A1 1/2015 Kim
2015/0028776 A1 1/2015 McMillan
2015/0054422 A1 2/2015 Koo
2015/0077991 A1 3/2015 Palfreyman et al.
2015/0115823 A1 4/2015 Serra
2015/0129398 A1 5/2015 Wilkins et al.
2015/0159852 A1 6/2015 Dahlen et al.
2015/0212263 A1 7/2015 Tzeng
2015/0260385 A1 9/2015 Brynjolfsson
2015/0345733 A1 12/2015 Bobbo et al.
2015/0345765 A1 12/2015 Horst et al.
2016/0123563 A1 5/2016 Ferguson et al.
2016/0174325 A1 6/2016 Monjo
2016/0178173 A1* 6/2016 Yadav ................... F21V 23/005 362/231
2016/0255516 A1 9/2016 Hill
2016/0278186 A1 9/2016 Van De Sluis et al.
2016/0375162 A1 12/2016 Marry
2016/0375163 A1 12/2016 Hawkins et al.
2017/0064790 A1* 3/2017 Clark .................... F21V 21/005
2017/0130941 A1* 5/2017 Ford .......................... F21S 4/28
2017/0171929 A1 6/2017 Erdener et al.
2017/0171932 A1 6/2017 Puvanakijjakorn
2017/0191631 A1 7/2017 Lentine et al.
2017/0325311 A1 11/2017 Athalye
2017/0374718 A1 12/2017 Fang et al.
2018/0031184 A1 2/2018 Yingchun
2018/0156423 A1 6/2018 Murby
2018/0252376 A1 9/2018 Hierzer
2018/0317306 A1 11/2018 Harris
2018/0376555 A1 12/2018 Wang
2019/0045593 A1* 2/2019 Miskin .................. H05B 45/39
2019/0098734 A1 3/2019 Dolan
2019/0140408 A1 5/2019 Gellert et al.
2019/0145614 A1 5/2019 Tuchler
2019/0195473 A1 6/2019 Tuchler et al.
2019/0264899 A1 8/2019 Erdener
2019/0271456 A1 9/2019 Hierzer
2019/0271461 A1 9/2019 Hierzer
2019/0387590 A1 12/2019 Hierzer
2020/0000250 A1 1/2020 Bergman et al.
2020/0044400 A1 2/2020 Gellert et al.
2020/0061391 A1 2/2020 Krishnaswamy et al.
2020/0100334 A1 3/2020 Han
2020/0149714 A1 5/2020 Tischler et al.
2020/0295803 A1 9/2020 Gellert et al.
2020/0403359 A1 12/2020 Gellert et al.
2021/0239304 A1 8/2021 Erdener et al.
2021/0352783 A1 11/2021 Tham
2022/0003365 A1 1/2022 McRae
2022/0053617 A1 2/2022 Zhang et al.

FOREIGN PATENT DOCUMENTS

CN 203573985 4/2014
CN 204046874 12/2014
CN 205979248 2/2017
CN 108036241 5/2018
CN 207778165 8/2018
CN 109539024 3/2019
HK 1198615 4/2015
JP 3875392 1/2007
JP 4590283 12/2010
JP WO2011/065047 6/2011
JP 2011165394 8/2011
JP 201214980 1/2012
JP 2013254665 12/2013
JP 2014157795 8/2014

(56) References Cited

FOREIGN PATENT DOCUMENTS

| | | |
|---|---|---|
| JP | 6473927 | 2/2019 |
| KR | 1020120135003 | 12/2012 |
| KR | 1020150021814 | 3/2015 |
| KR | 101677730 | 11/2016 |
| RU | 2358354 | 12/2008 |
| TW | 330233 | 6/1986 |
| TW | 295720 | 8/1994 |
| TW | 391600 | 9/1995 |
| WO | WO99/07187 | 2/1999 |
| WO | WO00/02421 | 1/2000 |
| WO | WO2010/021675 | 2/2010 |
| WO | WO2011143510 | 11/2011 |
| WO | WO2013021940 | 2/2013 |
| WO | WO2013/184166 | 12/2013 |
| WO | WO2014108870 | 7/2014 |
| WO | WO2015/162600 | 10/2015 |
| WO | WO2016168867 | 10/2016 |

OTHER PUBLICATIONS

"Low Drop Fixed and Adjustable Positive Voltage Regulators," Unisonic Technologies Co., LTD, Nov. 14, 2016.

* cited by examiner

MODULAR ARTICULATING LIGHTING

CROSS-REFERENCE TO RELATED APPLICATIONS

This application is a nonprovisional of U.S. Provisional Applications No. 63/401,813 filed Aug. 29, 2002, and 63/426,841, filed Nov. 21, 2022, both of which are hereby incorporated by reference in their entireties.

BACKGROUND

Lighting fixtures based on concatenated lamp heads that extend away from a power source typically include articulating links between the lamp heads that provide illumination. When the articulating links are used to transmit power to the lamp heads, the illumination is typically limited to a choice between two different illumination colors.

It would therefore be desirable to provide a light fixture with concatenated lamp heads that provide more than two different illumination colors.

Figure 1:
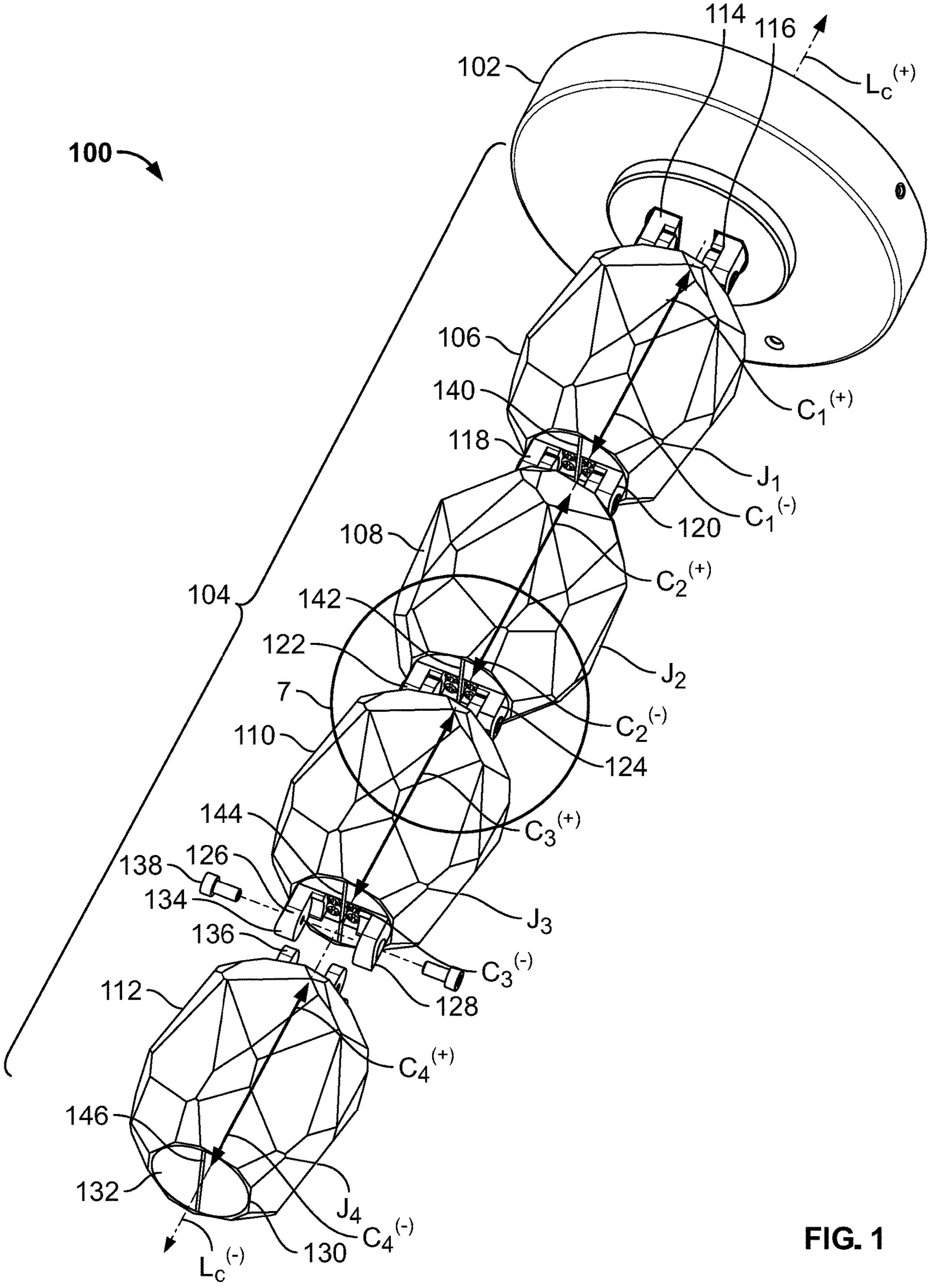
FIG. 1 shows schematically illustrative apparatus in accordance with principles of the invention.

The leftmost digit (e.g., "L") of a three-digit reference numeral (e.g., "LRR"), and the two leftmost digits (e.g., "LL") of a four-digit reference numeral (e.g., "LLRR"), generally identify the first figure in which a part is called-out.

DESCRIPTION

Apparatus and methods for lighting are provided.

The apparatus may include one or more jewels. A jewel may include a lamp head. A lamp head may include one or more of a light-emitting diode ("LED") light source, a circuit for providing current to the LED light source, structure for connection to another jewel, conductors for electrical continuity with another jewel, optically diffusive material, ornamental material and any other suitable features.

Elements of components that are in electrical continuity may include copper, aluminum or any other suitable electrically conductive material.

The apparatus may include a first jewel. The apparatus may include a second jewel. The first jewel may support the second jewel. The first jewel may support the second jewel by a first link. The first link may be configured to provide current from the first jewel to the second jewel. The first jewel may support the second jewel by a second link. The first link that may be configured for transmission of current between the first jewel and the second jewel. The second link that may be configured for transmission of current between the first jewel and the second jewel.

A link may provide articulation between neighboring jewels. A link may be a link that does not provide articulation between neighboring jewels.

The first and second links may be the only attachments of the second jewel to the first jewel. The first jewel may be configured to selectively emit three different colors of light. The second jewel may be configured to selectively emit three different colors of light. The second jewel may be configured to selectively emit the three different colors of the first jewel. The selection may be performed by a user using a switch. The switch may include a mechanical switch. The switch may include an electrical switch. The switch may include a software switch.

The first and second links may be the only electrical conductors between the first and second jewels.

The first link may be configured to have a first voltage that corresponds to a first driver pole. The second link may be configured to have a second voltage that corresponds to a second driver pole.

The three colors may correspond to a color-1 LED string, a color-2 LED string and the color-1 LED string and the color-2 LED string. A string may coincide with all or some of a branch.

The color-1 LED string may be configured to emit a first of the three colors. The color-2 LED string may be configured to emit a second of the three colors.

The color-1 LED string may have a high end that is coupled to the first voltage. The color-1 LED string may have a low end that is coupled to the second voltage. The color-2 LED string may have a high end that is coupled to the second voltage. The color-2 LED string may have a low end that is coupled to the first voltage.

One or more of the jewels may include one or more of the strings. A color-1 string may be disposed in the second jewel. A color-2 string may be disposed in the second jewel.

The first jewel may include a color-1 LED string. The first jewel may include a color-2 LED string. The color-1 LED string may have a high end that is coupled to a first pole voltage. The color-1 LED string may have a low end that is coupled to a second pole voltage. The color-2 LED string may have a high end that is coupled to a second pole voltage. The color-2 LED string may have a low end that is coupled to a first pole voltage.

A first of the three colors may correspond to a first correlated color temperature ("CCT"). A second of the three colors may correspond to a second CCT. A third of the three colors may correspond to a third CCT.

One or more of the three colors may correspond to red, green, blue or any other suitable color.

The apparatus may include a user-operable switch. The switch may be configured for selection of one of the three colors.

The first jewel may be configured to emit the three lights.

The apparatus may include a third jewel. The third jewel may be supported by the second jewel. The third jewel may be supported by the second jewel by a third link. The third link may be configured to provide current from the second jewel to the third jewel. The third jewel may be supported by the second jewel by a fourth link. The fourth link may be configured to provide current from the second jewel to the third jewel.

The third and fourth links may be the only attachments of the third jewel to the second jewel. The third jewel may be configured to emit the three colors.

The apparatus may include a terminal jewel. The terminal jewel may be configured to link only to a single neighboring jewel. The terminal jewel may include links on only one end of the terminal jewel. A terminal end of terminal jewel may include a surface with no structural extensions. The terminal end may include an ornamental surface.

The terminal jewel may be configured to link only to two neighboring jewels. The terminal link may be configured to link mechanically to both of the neighboring jewels and electrically with only one of the neighboring jewels.

A user may connect a number of jewels to the end of a chain of jewels without performing an electrical wiring task other than connection of an addition jewel to the last jewel of the chain via links.

The apparatus may include a microcontroller. The microcontroller may be configured to distribute current between the first link and the second link.

The apparatus may include a transistor bridge. The bridge may adjust current flow through the first and second links. The bridge may adjust the current in conformance with signals from the microcontroller.

The apparatus may include a canopy. The canopy may be configured to be fixed to a ceiling, a wall or any other suitable structure.

The microcontroller and the transistor bridge may be disposed in the canopy.

The apparatus may include a user-operable switch that is configured for selection of one of the three colors. The switch may be disposed in the canopy. The switch may be in communication with the microcontroller.

The microcontroller may be configured to provide positive voltage to the first pole to energize color-1 LED strings. The microcontroller may be configured to provide positive voltage to the first pole to energize color-2 LED strings.

The first color may include a high CCT emission. The second color may include a low CCT emission. The third color may include a mixture of the high CCT emission and the low CCT emission.

The microcontroller may be configured to alternately energize the color-1 and color-2 LED strings to produce a third of the three colors. Alternation between the color-1 and color-2 LED strings may be a temporal alternation.

the fixture may include a canopy. The canopy may be mounted to a ceiling. The fixture may include one or more lamp heads. Four lamp heads are shown. The lamp heads may be attached to each other by one or more links. One or more lamp heads may be attached to the canopy by a one or more links. The links may be electrically conductive.

The fixture may include a section or sections. A section may include one or more jewels. A section may include a chain. The sections may be modular such that a section may be installable at the end of another section or to the canopy. Different sections may have different numbers of jewels. Different sections may have different lengths.

A section may be an "intermediate section." An intermediate section may include linking features on both ends. A section may be an "end section." An end section may have a linking feature on an end. An end section may have an attachment feature on the end. An end section may have an attachment feature on a different end. The attachment feature may provide for the addition or deployment of a linking feature.

The fixture may include a first section having jewels that are powered by a first driver. The fixture may include a second section having jewels that are powered by a second driver. The first section and the second section may be linked to each other by terminal jewels that are mechanically linked to each other but may be electrically isolated from each other.

Table 1 lists illustrative numbers of jewels in a section along with illustrative corresponding lengths.

TABLE 1

Illustrative numbers of jewels in a section along with illustrative corresponding lengths.
Illustrative numbers of jewels per section, lengths

| Number of jewels (N) | Length (in.) |
|---|---|
| 6 | 24 |
| 8 | 36 |
| 14 | 48 |
| 18 | 84 |
| 22 | 108 |
| 40 | 132 |
| Other suitable numbers | Other suitable lengths |

A swag and suspension cable may be provided for decoration that may include an additional suspension point.

The fixture may be a fixture that includes no more than two drivers to power up to 40 jewels. This may reduce a size requirement of the canopy.

A link may include a hinge, a pin, a snap, a tab, a hook, a magnet or any other suitable attachment arrangement. The link may conduct electricity. The link may provide for articulation of the jewels relative to each other or relative to the canopy. A top jewel may be linked to the canopy.

A jewel may have a form. The form may include a bulb, a jewel, a crystal, a panel, a tile or any other suitable form. The panel may be square, rectangular, triangular or any other suitable shape.

Each jewel may include one or more LED ("light-emitting diode") light sources. The fixture may include an electrical path. The path may include a first branch that runs from the canopy through the jewels to a terminal jewel. The path may include a second branch that runs from the terminal jewel through the jewels to the canopy.

A branch may include a link. A branch may include a printed circuit board ("PCB"). A branch may include a light-emitting diode ("LED"). A branch may include a conductor. A branch may include a wire. The branch may be a branch that does not include a wire. The branch may be a branch that includes a wire that is not part of the link. A branch may include one or more of the foregoing. A branch may include one or more of the foregoing in series. A branch may include one or more of the foregoing in parallel. A branch may provide power to LEDs along the branch by conducting current through one or more of the foregoing.

A first jewel may provide current to a second jewel along a path. A segment of the path that provides the current from the first jewel to the second jewel may be a segment that does not include wire. The segment may maintain electrical continuity between the first jewel and the second jewel through a range of orientations of the second jewel relative to the first jewel. The segment may maintain a mechanical relationship between the first jewel and the second jewel through the range of orientations. The segment may include a hinge. The hinge may provide sufficient friction to hold the second jewel in a user-selected orientation relative to the first jewel. The hinge may be a hinge that does not provide sufficient friction to hold the second jewel, under the weight of the second jewel, in an orientation relative to the first jewel.

The segment may include a plastically deformable material. The segment may include an elastically deformable material.

The fixture may include an LED driver circuit. The fixture may include a power supply. One or both of the driver circuit and the power supply may be disposed in the canopy. The fixture may include a switch. The switch may have a selector. The selector may have one or more settings. A first setting may correspond to a first LED type. A second setting may correspond to a second LED type. A third setting may correspond to a third LED type. An LED type may correspond to a color. The color may include red. The color may include green. The color may include white. The color may include a correlated color temperature ("CCT").

The electrical path may be in electrical continuity with the driver circuit. The driver circuit may include a positive voltage output terminal. The driver circuit may include a negative voltage output terminal. The first branch may be coupled to the positive voltage output terminal. The second branch may be coupled to the negative voltage output terminal. The first branch and the second branch may be coupled to each other at the terminal jewel.

The apparatus may include a first jewel. The apparatus may include a second jewel. The first jewel may include a first LED light source. The second jewel may include a second LED light source. The apparatus may include a first LED light source control circuit. The apparatus may include a second LED light source control circuit.

The first jewel may be configured to be mechanically and electrically linked to a first jewel chain that is configured to be powered by the first LED light source control unit. The second jewel may be configured to be mechanically and electrically linked to a second jewel chain that is configured to be powered by the second LED light source control unit. The second jewel may be configured to be mechanically linked to and electrically isolated from the first jewel. Both the first and the second jewel may be jewels that are configured such that a user can select from three different colors of light for emission by the jewels.

FIG. 1 shows illustrative fixture 100. Fixture 100 may include canopy 102. Canopy 102 may be configured to be attached to a support. The support may include a ceiling.

Fixture 100 may include chain 104 of jewels (J1 . . . J4). Chain 104 may define central axis $L_c$. Axes may define an upward direction. The upward direction may be designated by (+). Axes may define a downward direction. The downward direction may be designated by (−). Axis Lc may follow a central path through chain 104. Chain may 104 may have a straight configuration. Chain 104 may have a curved configuration.

Fixture 100 may include jewel 106 (J1). Fixture 100 may include jewel 108 (J2). Fixture 100 may include jewel 110 (J3). Fixture 100 may include jewel 112 (J4). Fixture 104 may be configured to include any suitable number jewels. Jewels J1 . . . J4 may include central axes C1 . . . C4, respectively.

Fixture 100 may include one or more links such as 114, 116, 118, 120, 122, 124, 126, 128 and any other suitable links. A link may include an upper extension such as 134. The link may include a lower extension such as 136. The upper and lower extension may be joined by a pin such as 138.

Jewel 112 may be a terminal jewel. A terminal jewel may have links on only a (+) end. Jewel 112 may include terminal end 130. Terminal end 130 may be an end that does not include structure on a (−) end for supporting a jewel. Terminal end 130 may include one or more ornamental surfaces. Terminal end 130 may be translucent. Terminal end 130 may include flat surface 132.

Canopy 102 may include LED current distribution circuitry (not shown). The circuitry may include a first voltage pole. The circuitry may include a second voltage pole. The two voltage poles be in electrical continuity with the links.

Chain 104 may define a first branch. Chain 104 may define a second branch. The first branch may be equipotential with the first pole. The second branch may be equipotential with the second pole. Links 114, 118, 122 and 126 may be part of the first branch. Links 116, 120, 124 and 128 may be part of the second branch. The first and second poles may be separated by electrical insulation. The first and second branches may be separated by electrical insulation. The insulation may include insulation 140, 142, 144 and 146.

Fixture 100 may include illustrative cover 150.

The first branch may deliver current to jewels J1 . . . J4 to emit light of a first color. The second branch may deliver current to jewels J1 . . . J4 to emit light of a second color. The first and second branches may deliver current to jewels J1 . . . J4 to emit light of a third color.

Fixture 100 may have a user-operable switch (not shown) for selecting between the first color, the second color and the third color. The user-operable switch may be disposed in canopy 102.

Each jewel may include a color-1 LED string (not shown) to emit light of the first color. Each jewel may include a color-2 LED string (not shown) to emit light of the second color. The circuitry may produce the third color using the color-1 LED string and the color-2 LED string.

The links may be the only structural connections between the jewels. The links may be the only electrical connections between the jewels. Links 114 and 116 may be the only structural connections between canopy 102 and jewel 106. Links 114 and 116 may be the only electrical connections between canopy 102 and jewel 106.

Figure 2:
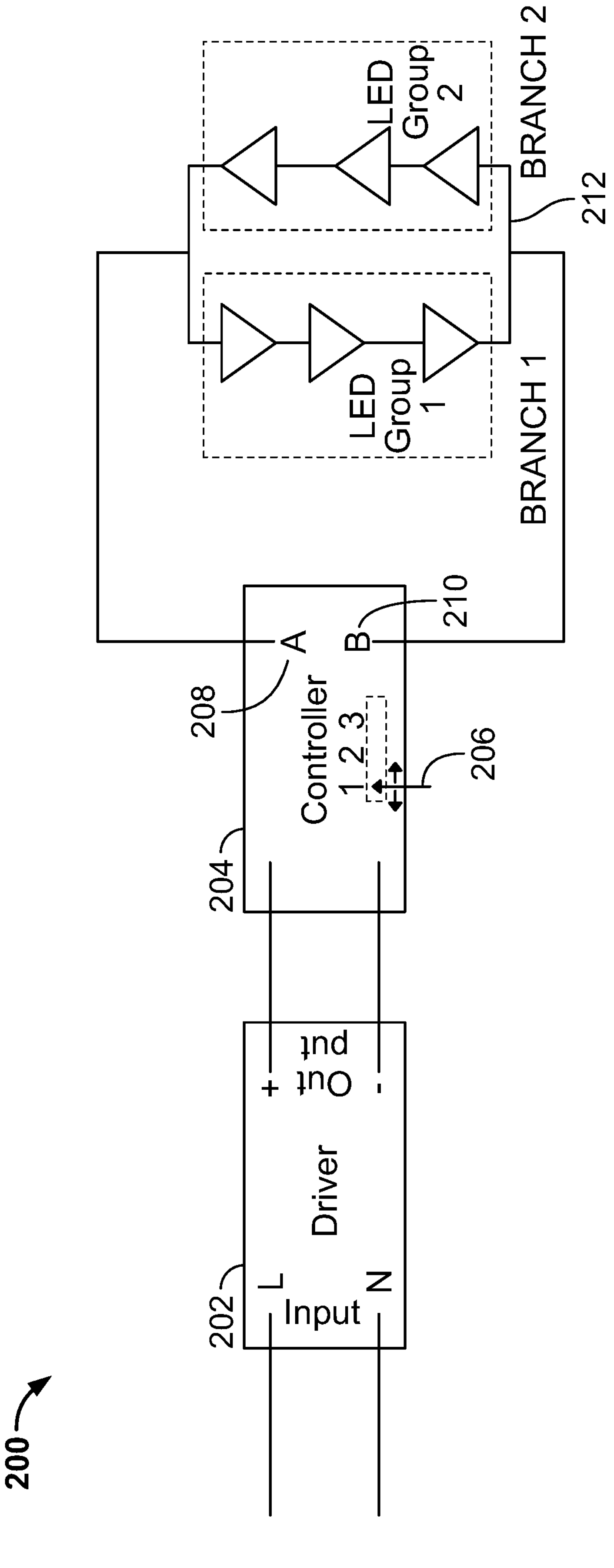
FIG. 2 shows schematically illustrative apparatus in accordance with principles of the invention.

FIG. 2 shows illustrative architecture 200 for providing three CCTs. Architecture 200 may include illustrative driver

202. Architecture 200 may include illustrative controller 204. Architecture 200 may include illustrative LED branches 1 and 2. Branch 1 may include LEDs (“LED group 1”) of a first CCT. Branch 2 may include LEDs (“LED group 2”) of a second CCT. The second CCT may be different from the first CCT. The first CCT may be 3,000° K. The second CCT may be 4,000° K.

Controller 204 may include user-operable CCT selector 206. Selector 206 may have two or more settings, e.g., “1,” “2,” and “3.” The different settings may correspond to different outputs at poles 208 (“A”) and 210 (“B”). Architecture 200 may include illustrative LED module circuit 212. Selector 206 may be mechanically operable. Selector 206 may be electronically operable. Selector 206 may be operably electronically by software. Selector 206 may be operably remotely from a mobile device. Selector 206 may be operably wirelessly.

Table 2 lists illustrative ranges that may include nominal CCT values for a first CCT or a second CCT.

TABLE 2

Illustrative ranges that may include nominal CCT values for the first and second CCTs.
Illustrative range endpoints (° K)

| Lower | Upper | Lower | Upper |
|---|---|---|---|
| <1800 | 1800 | 3400 | 3500 |
| 1800 | 1900 | 3500 | 3600 |
| 1900 | 2000 | 3600 | 3700 |
| 2000 | 2100 | 3700 | 3800 |
| 2100 | 2200 | 3800 | 3900 |
| 2200 | 2300 | 3900 | 4000 |
| 2300 | 2400 | 4000 | 4100 |
| 2400 | 2500 | 4100 | 4200 |
| 2500 | 2600 | 4200 | 4300 |
| 2600 | 2700 | 4300 | 4400 |
| 2700 | 2800 | 4400 | 4500 |
| 2800 | 2900 | 4500 | 4600 |
| 2900 | 3000 | 4600 | 4700 |
| 3000 | 3100 | 4700 | 4800 |
| 3100 | 3200 | 4800 | 4900 |
| 3200 | 3300 | 4900 | 5000 |
| 3300 | 3400 | 5000 | >5000 |
| Other suitable lower endpoints | Other suitable upper endpoints | Other suitable lower endpoints | Other suitable upper endpoints |

When selector 206 is in position “1”, the controller will control pole A to be the “+” pole, pole B to be the “−” pole, LED group 1 will be on, and LED group 2 will be off. At this time, the color temperature of the module is the LED group 1 color temperature.

When selector 206 is in position “3”, the controller will control pole A to be the “−” pole, pole B to be the “+” pole, LED group 1 will be off, and LED group 2 will be on. At this time, the color temperature of the module is LED 2 color temperature.

When selector 206 is in position “2”, the controller will control pole A a first fraction of the time to be the “+” pole and a second fraction of the time to be the “−” pole. Pole B will have polarity opposite that of pole A. When the positive and negative switching frequency is large enough, the color temperature of the fixture is a mixture of the CCTs of LED group 1 and LED group 2. The mixed CCT may be a CCT value in a range listed in Table 2. The mixed CCT may be 3,500° K, for example.

A switching cycle, during which LED group 1 are illuminated for a first fraction and LED group 2 are illuminated for a second fraction, may have any suitable duration.

The first and second fractions may be the same. The first and second fractions may be different. A sum of the first and second fractions may be about 1. The first and second fractions may be sized to result in a desired CCT mix between LED group 1 and LED group 2. Table 4 lists illustrative ranges that may include the first and second fractions.

TABLE 3

Ranges that may include the first and second fractions.
Illustrative range endpoints

| Lower | Upper | Lower | Upper |
|---|---|---|---|
| <0.05 | 0.05 | 0.50 | 0.55 |
| 0.05 | 0.10 | 0.55 | 0.60 |
| 0.10 | 0.15 | 0.60 | 0.65 |
| 0.15 | 0.20 | 0.65 | 0.70 |
| 0.20 | 0.25 | 0.70 | 0.75 |
| 0.25 | 0.30 | 0.75 | 0.80 |
| 0.30 | 0.35 | 0.80 | 0.85 |
| 0.35 | 0.40 | 0.85 | 0.90 |
| 0.40 | 0.45 | 0.90 | 0.95 |
| 0.45 | 0.50 | 0.95 | >0.95 |
| Other suitable lower endpoints | Other suitable upper endpoints | Other suitable lower endpoints | Other suitable upper endpoints |

Figure 3:
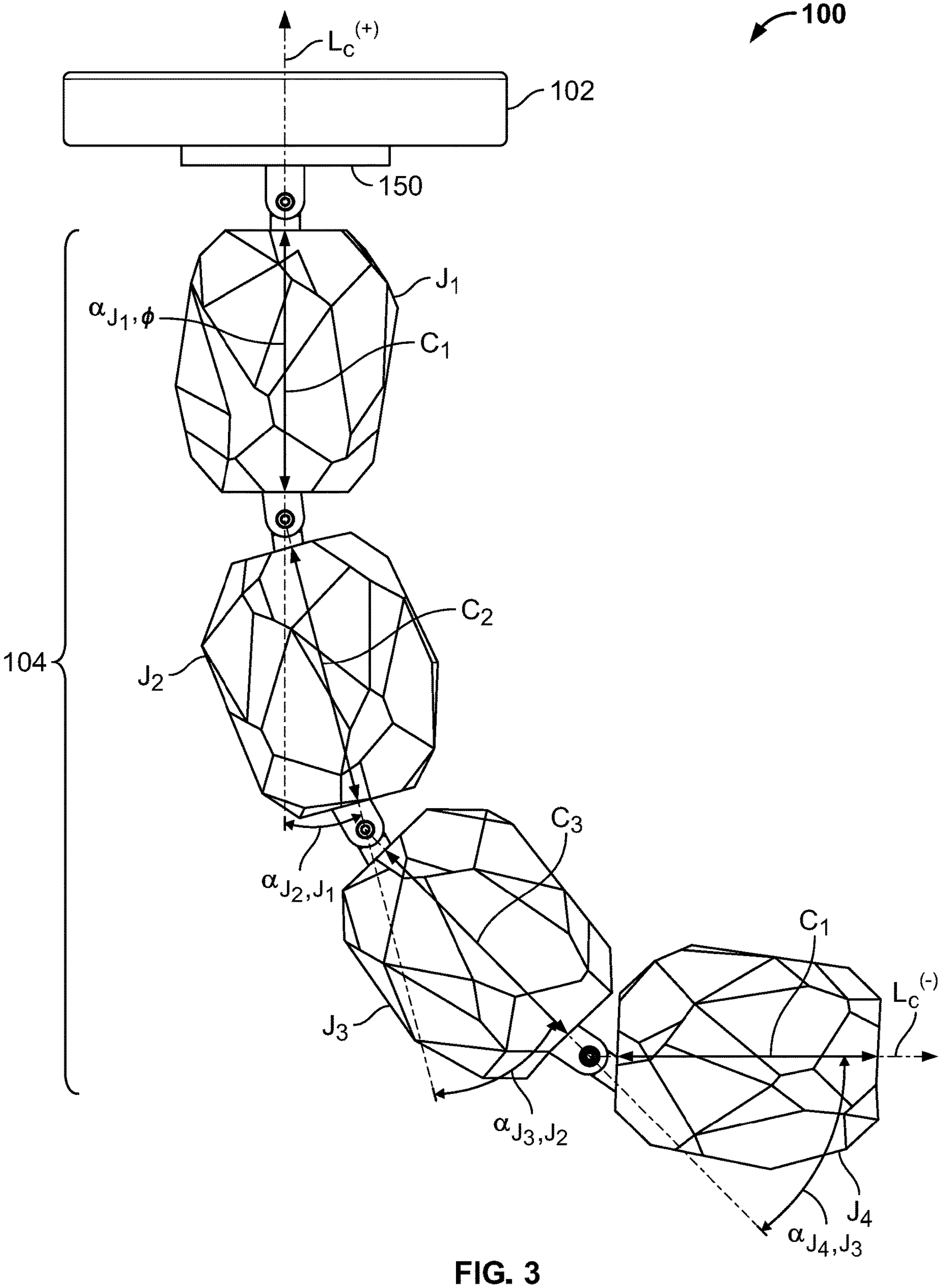
FIG. 3 shows schematically illustrative apparatus in accordance with principles of the invention.

FIG. 3 shows illustrative angulation of the jewels about hinges. Jewels $J_n$, n=1−N, may rotate relative to neighboring jewels through angles $\alpha J_n, J_{n-1}$ Jewel J1 may rotate relative to canopy 102. Table 4 lists illustrative ranges that may include angles α.

TABLE 4

Illustrative ranges that may include angles α (and −α).
Illustrative ranges (deg. of arc)

| From | To | From | To |
|---|---|---|---|
| <5 | 5 | 90 | 95 |
| 5 | 10 | 95 | 100 |
| 10 | 15 | 100 | 105 |
| 15 | 20 | 105 | 110 |
| 20 | 25 | 110 | 115 |
| 25 | 30 | 115 | 120 |
| 30 | 35 | 120 | 125 |
| 35 | 40 | 125 | 130 |
| 40 | 45 | 130 | 135 |
| 45 | 50 | 135 | 140 |
| 50 | 55 | 140 | 145 |
| 55 | 60 | 145 | 150 |
| 60 | 65 | 150 | 155 |
| 65 | 70 | 155 | 160 |
| 70 | 75 | 160 | 165 |
| 75 | 80 | 165 | 170 |
| 80 | 85 | 170 | 175 |
| 85 | 90 | 175 | >175 |
| Other suitable lower limits | Other suitable upper limits | Other suitable lower limits limits | Other suitable upper limits |

Figure 4:
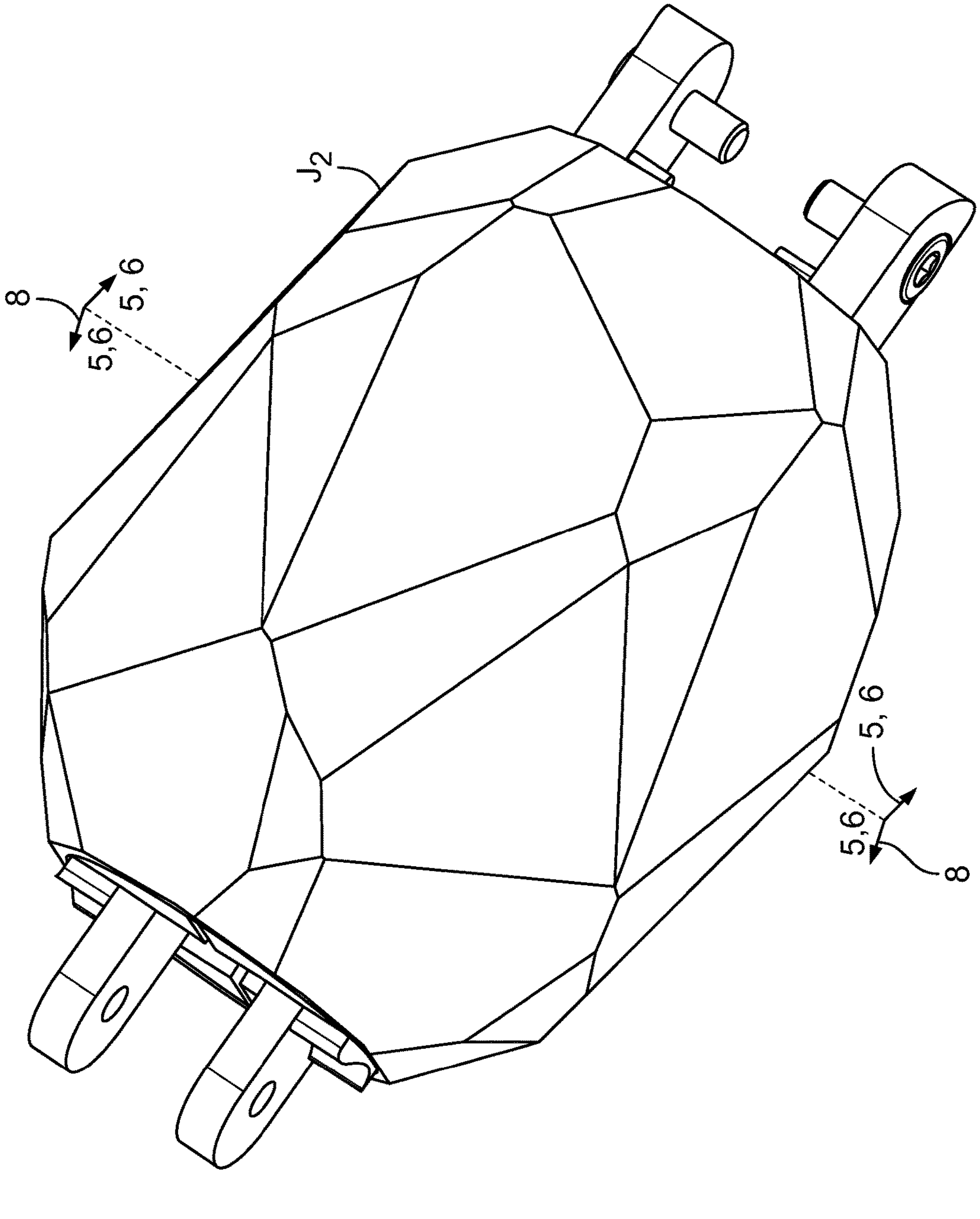
FIG. 4 shows schematically illustrative apparatus in accordance with principles of the invention.

FIG. 4 shows illustrative jewel J2 disconnected from neighboring jewels. FIG. 4 shows an illustrative jewel. The jewel may include inner hinge posts (top left). One of the inner hinge posts may be part of branch 1. The other may be part of branch 2. The jewel may include outer hinge posts (bottom right). One of the outer hinge posts may be part of branch 1. The other may be part of branch 2. The inner hinge posts may of the jewel may be connected mechanically to outer hinge posts of neighboring hinge posts. The connections may be made by a pin. The connections may provide electrical continuity in a branch.

Figure 5:
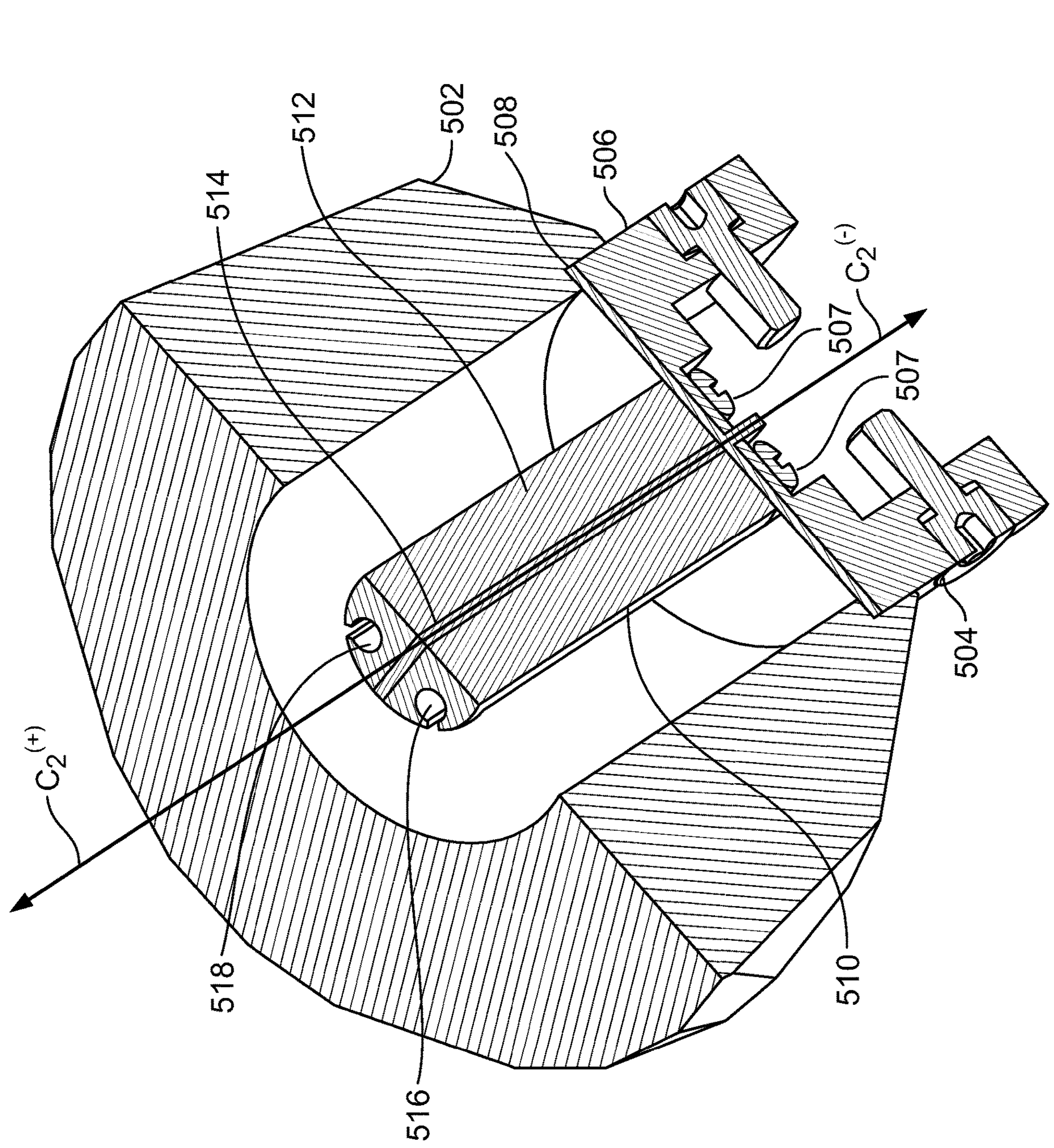
FIG. 5 shows a partial double cross-section taken along view lines 5-5 (shown in FIG. 4).

FIG. 5 is a view taken along view lines 5,6-5,6 (shown in FIG. 4). The Jewel J2 may include optically diffusive element 502. Jewel J2 may include conductive base 504. Jewel J2 may include conductive base 506. Jewel J2 may include electrical insulator 508. Jewel J2 may include pole 510. Jewel J2 may include pole 512. The poles may include LEDs. Jewel J2 may include electrical insulator 514.

Poles 510 and 512 may include material that provides structural support to jewel J2. Poles 510 and 512 may be fastened to bases 504 and 506 by electrically conductive fasteners. The electrically conductive fasteners may include screws such as screws 507. Poles 510 and 512 may include holes 516 and 518 to receive the fasteners. A hole may traverse the length of the pole. A hole may not traverse the length of the pole. The fasteners may include screws.

Poles 510 and 512 may correspond to poles A and B of FIG. 2. Poles A and B may provide voltage across a circuit board. The circuit board may include LEDs such as those in branches 1 and 2 of FIG. 2.

Figure 8:
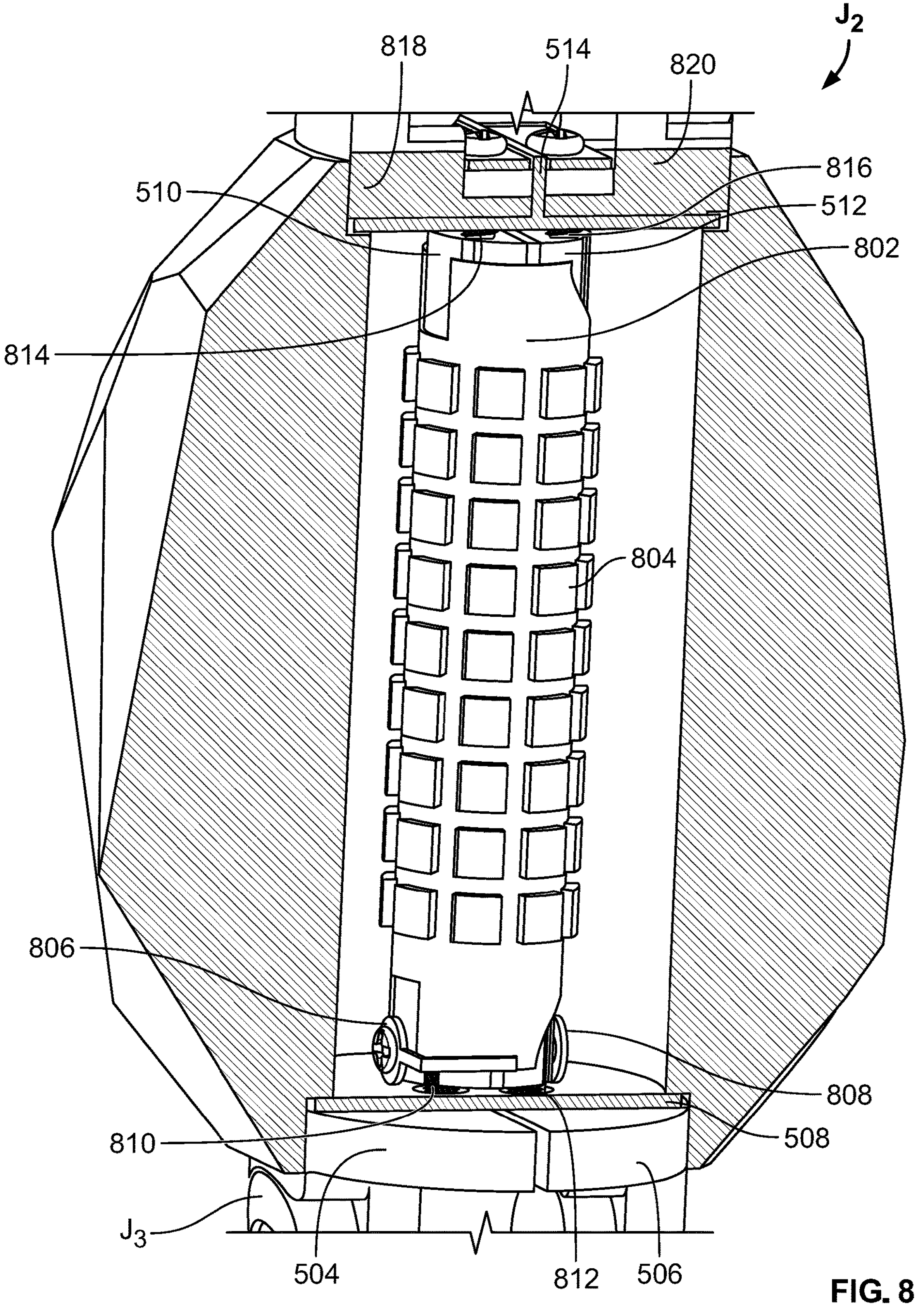
FIG. 8 shows a partial cross-section taken along view lines 8-8 (shown in FIG. 4).

Poles 510 and 512 may thus be part of branches 1 and 2, respectively. The top of the jewel may be constructed in an analogous manner to what is shown in FIG. 8.

Figure 6:
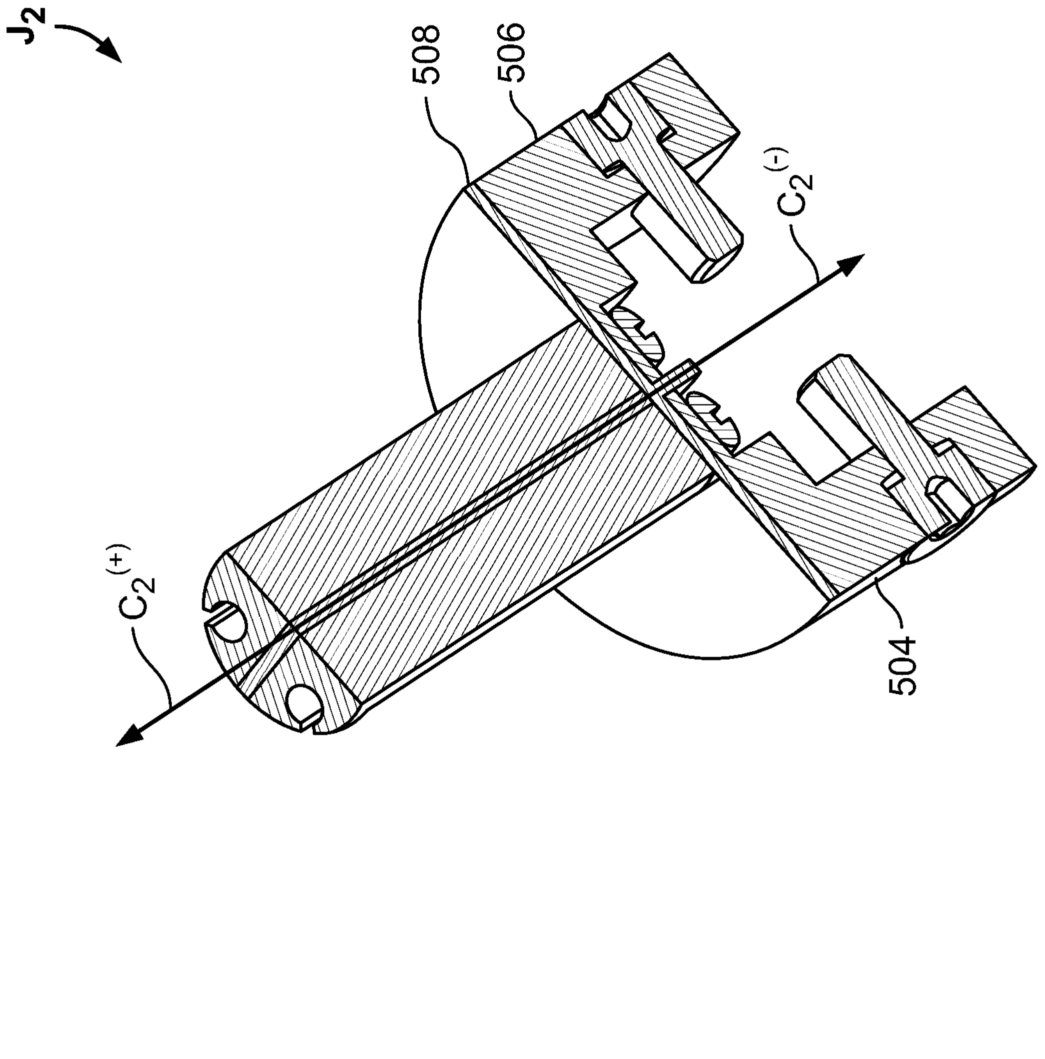
FIG. 6 shows a partial double cross-section taken along view lines 6-6 (shown in FIG. 4).

FIG. 6 shows that insulator 508 may have an outer edge that is aligned with the outer edges of bases 504 and 506.

Figure 7:
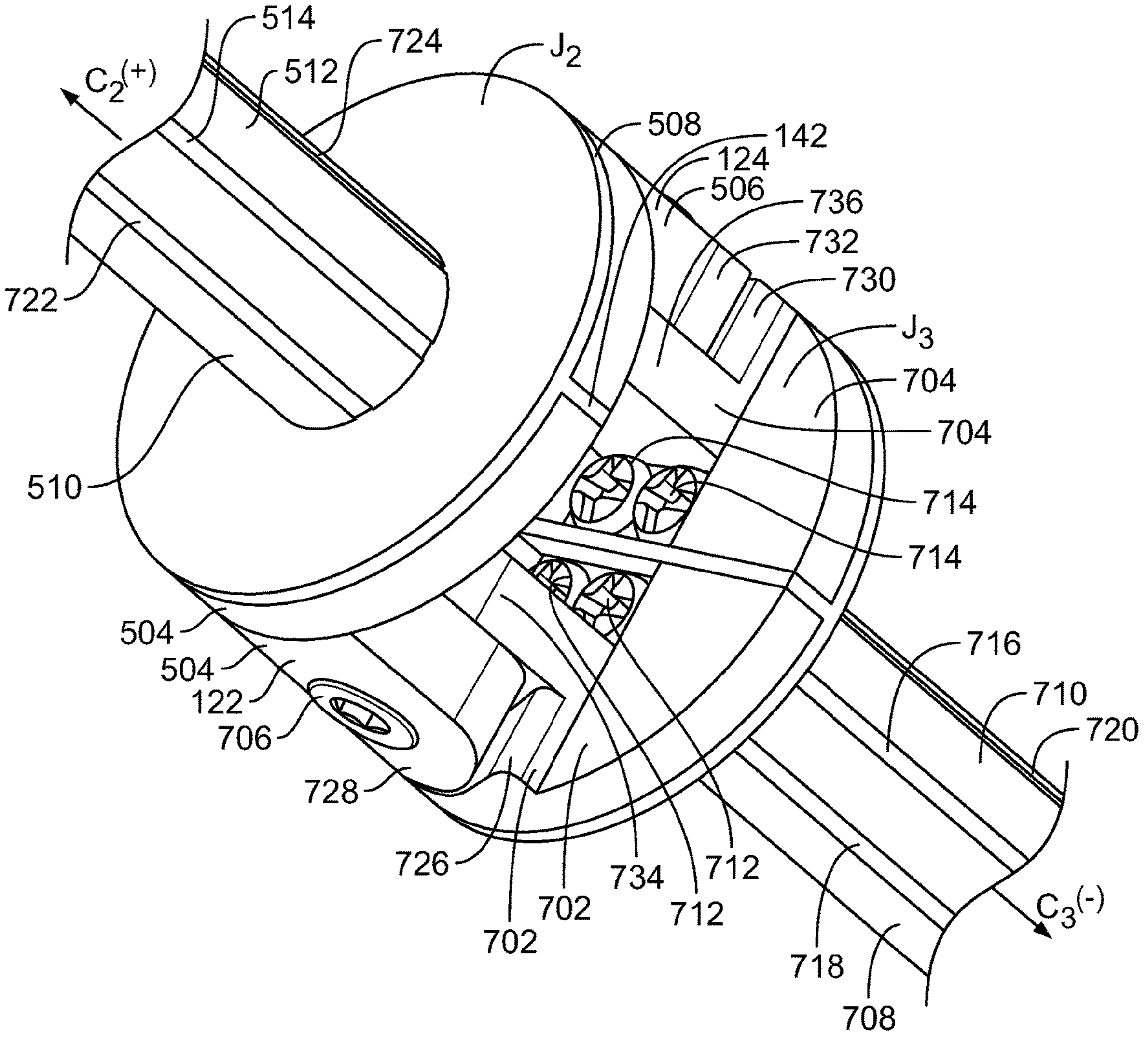
FIG. 7 shows in part view "7" (shown in FIG. 1).

FIG. 7 shows jewel J2 linked to jewel j3 in view 7 (shown in FIG. 1) with diffusive elements removed. Base 504 of jewel J2 may be linked to base 702 of jewel J3. The link may include pivot 706. Base 506 of jewel J2 may be linked to base 704 of jewel J3. The link may include pivot (not shown; 708). The bases and the pivots may be electrically conducting. Pole 708 may be in electrical continuity with base 702 via fasteners 712. Fasteners 712 may include screws. Pole 708, base 702 and fasteners 712 may be part of the first branch.

Pole 710 may be in electrical continuity with base 704 via fasteners 714. Fasteners 714 may include screws. Pole 710, base 704 and fasteners 714 may be part of the second branch.

Jewel J3 may include electrical insulation 714. Jewel J3 may include insulation 716. Pole 708 may include hole 718. Pole 710 may include hole 720. Holes 718 and 720 may have one or more features in common with holes 516 and 518. Each of poles 708 and 710 may include one or more other holes corresponding to fasteners 712 and 714.

Pole 510 may include hole 722. Pole 512 may include hole 724. Holes 722 and 724 may have one or more features in common with holes 516 and 518.

Base 702 may include shoulder 726. Shoulder 726 may be contoured to provide clearance for boss 728 of base 504. Base 702 may include shoulder 730. Shoulder 730 may be contoured to provide clearance for boss 732 of base 506. Bases 504 and 506 may include corresponding shoulders for bosses 734 and 736 of bases 702 and 704.

FIG. 8 shows jewel J2 in a view taken along lines 8-8 (shown in FIG. 4). Jewel J2 may include printed circuit board ("PCB") 802. PCB 802 may include an LED module circuit (not shown). The circuit may have one or more features in common with LED module circuit 212 (shown in FIG. 2). PCB 802 may include LEDs such as 804. Some of the LEDs may be arranged along the first branch. Some of the LEDs may be arranged along the second branch. Some of the LEDs may be correspond to LED group 1 (shown in FIG. 2). Some of the LEDs may be correspond to LED group 2 (shown in FIG. 2). Jewel 2 may include jumpers such as 806 and 808. Jumper 806 may be in electrical continuity with pole 510 and the LED module circuit. Jumper 806 may be in electrical continuity with pole 510 and the LED module circuit.

Jewel J2 may include screws 810, 812, 814 and 816. Jewel J2 may include base 818 and base 820.

Base 504 may be in electrical continuity with jewel J3. Base 504 may be in electrical continuity with screw 810. Screw 810 may be in electrical continuity with pole 510. Pole 510 may be in electrical continuity with screw 814. Screw 814 may be in electrical continuity with base 818. Base 818 may be in electrical continuity with jewel J1.

Base 506 may be in electrical continuity with jewel J3. Base 506 may be in electrical continuity with screw 812. Screw 812 may be in electrical continuity with pole 512. Pole 512 may be in electrical continuity with screw 816. Screw 816 may be in electrical continuity with base 820. Base 820 may be in electrical continuity with jewel J1.

Figure 9:
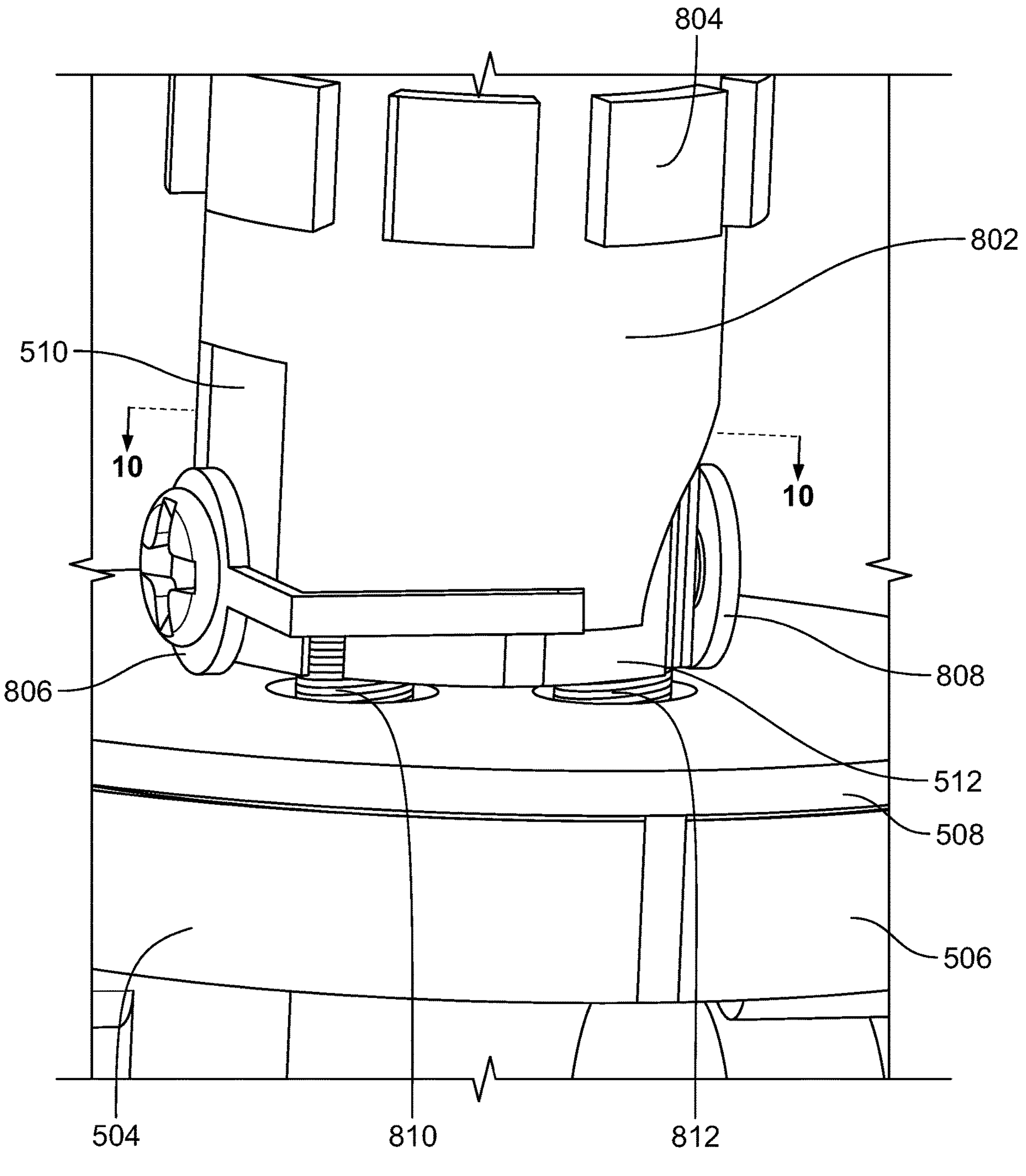
FIG. 9 shows a part of the apparatus shown in FIG. 8.

FIG. 9 shows a portion of jewel J2.

Figure 10:
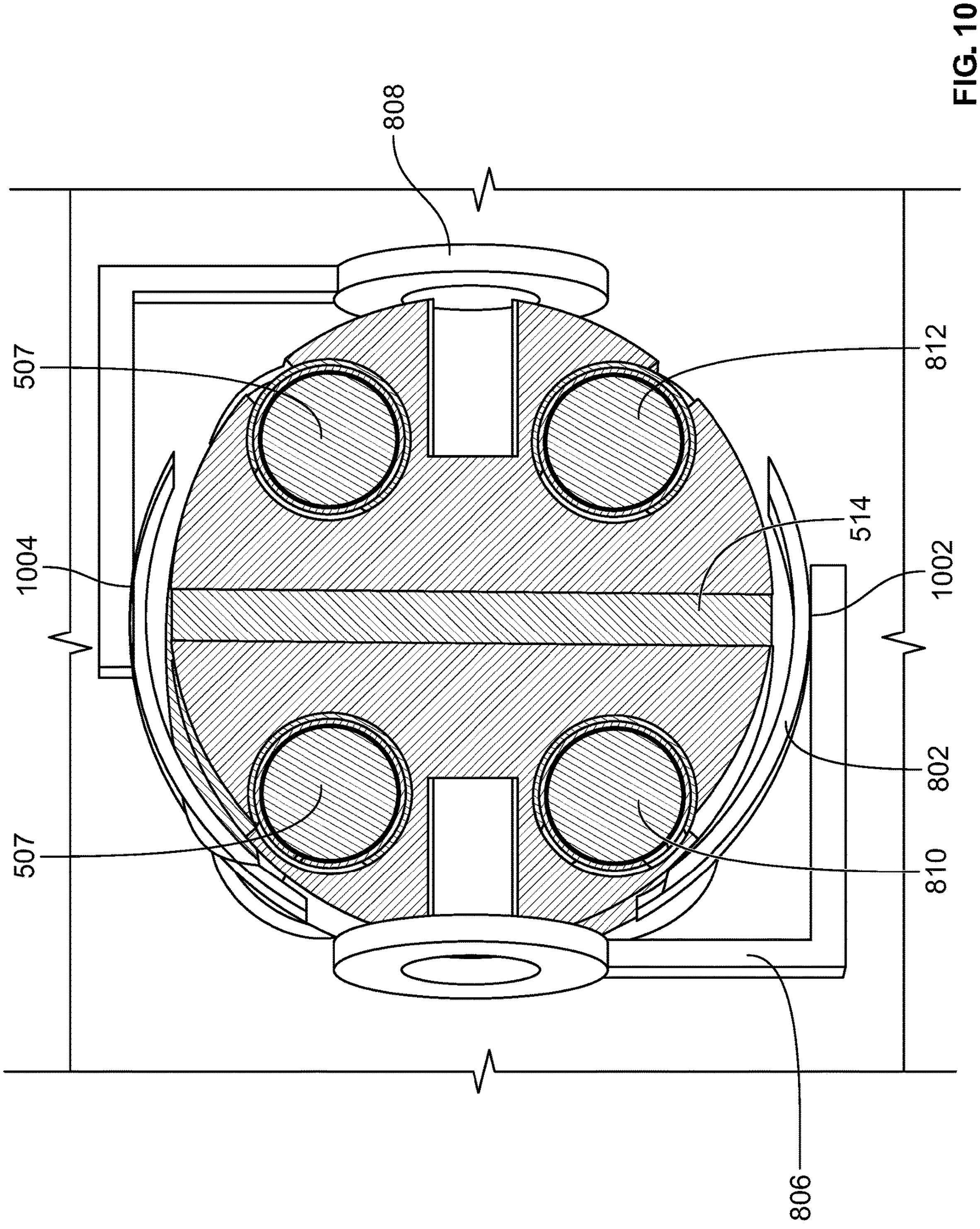
FIG. 10 shows a partial cross-section taken along lines 10-10 (shown in FIG. 9).

FIG. 10 shows in part a view of jewel J2 taken along lines 10-10 (shown in FIG. 9). Jumpers 806 and 808 may be fixed to and in electrical communication with terminals (not shown) in PCB 802 that correspond to poles A and B (shown in FIG. 2) at contacts 1002 and 1004, respectively. Contacts 1002 and 1004 may include solder, welding, fasteners or any other suitable contacts.

Figure 11:
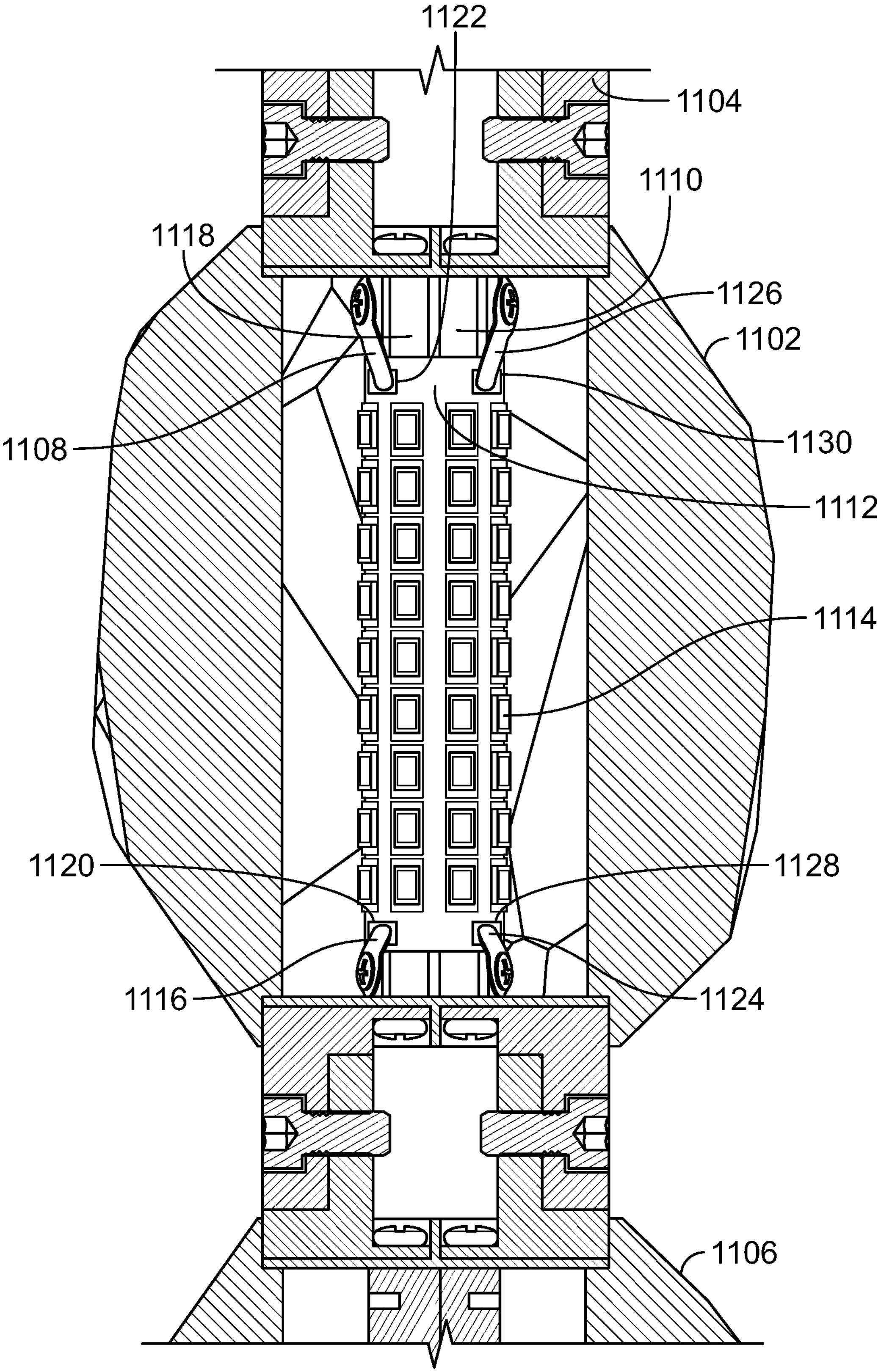
FIG. 11 shows a view, analogous to that taken along lines 11-11 (shown in FIG. 4), of apparatus in accordance with the principles of the invention.

FIG. 11 shows illustrative jewel 1102 in a view similar to that taken along lines 8-8 (shown in FIG. 4). Jewel 1102 may have one or more features in common with one or more of jewels $J_n$. Jewel 1102 may be linked to jewel 1104. Jewel 1102 may be linked to jewel 1106. Jewel 1102 may include pole 1108. Jewel 1102 may include pole 1110. Pole 1108 may correspond to pole A (shown in FIG. 2). Pole 1110 may correspond to pole B (shown in FIG. 2).

Jewel 1102 may include PCB 1112. PCB 1112 may include LED group 1114.

PCB 1102 may include an LED module circuit (not shown). The circuit may have one or more features in common with LED module circuit 212 (shown in FIG. 2). PCB 1102 may include LEDs such as 1104. Some of the LEDs may be arranged along the first branch. Some of the LEDs may be arranged along the second branch. Some of the LEDs may be correspond to LED group 1 (shown in FIG. 2). Some of the LEDs may be correspond to LED group 2 (shown in FIG. 2).

The LED module circuit may include a first LED string that corresponds to LED group 1 (shown in FIG. 2). The LED module circuit may include a second LED string that corresponds to LED group 1 (shown in FIG. 2). The first a second string may be arranged electronically parallel to each other. The LED module circuit may include a third LED string that corresponds to LED group 2 (shown in FIG. 2). The LED module circuit may include a fourth LED string that corresponds to LED group 2 (shown in FIG. 2).

Jewel 1102 may include jumpers such as 1116 and 1118. Jumper 1116 may be in electrical continuity with pole 1108. Jumper 1118 may be in electrical continuity with pole 1110. Jumper 1116 may be in electrical continuity with pole 1120 of PCB 1112. Jumper 1118 may be in electrical continuity with pole 1122 of PCB 1112. Both of poles 1120 and 1122 may correspond to pole A (shown in FIG. 2).

Jewel 1102 may include jumpers such as 1124 and 1126. Jumper 1124 may be in electrical continuity with pole 1110. Jumper 1126 may be in electrical continuity with pole 1110. Jumper 1124 may be in electrical continuity with pole 1128 of PCB 1112. Jumper 1126 may be in electrical continuity with pole 1130 of PCB 1112. Both of poles 1128 and 1130 may correspond to pole B (shown in FIG. 2).

Figure 12:
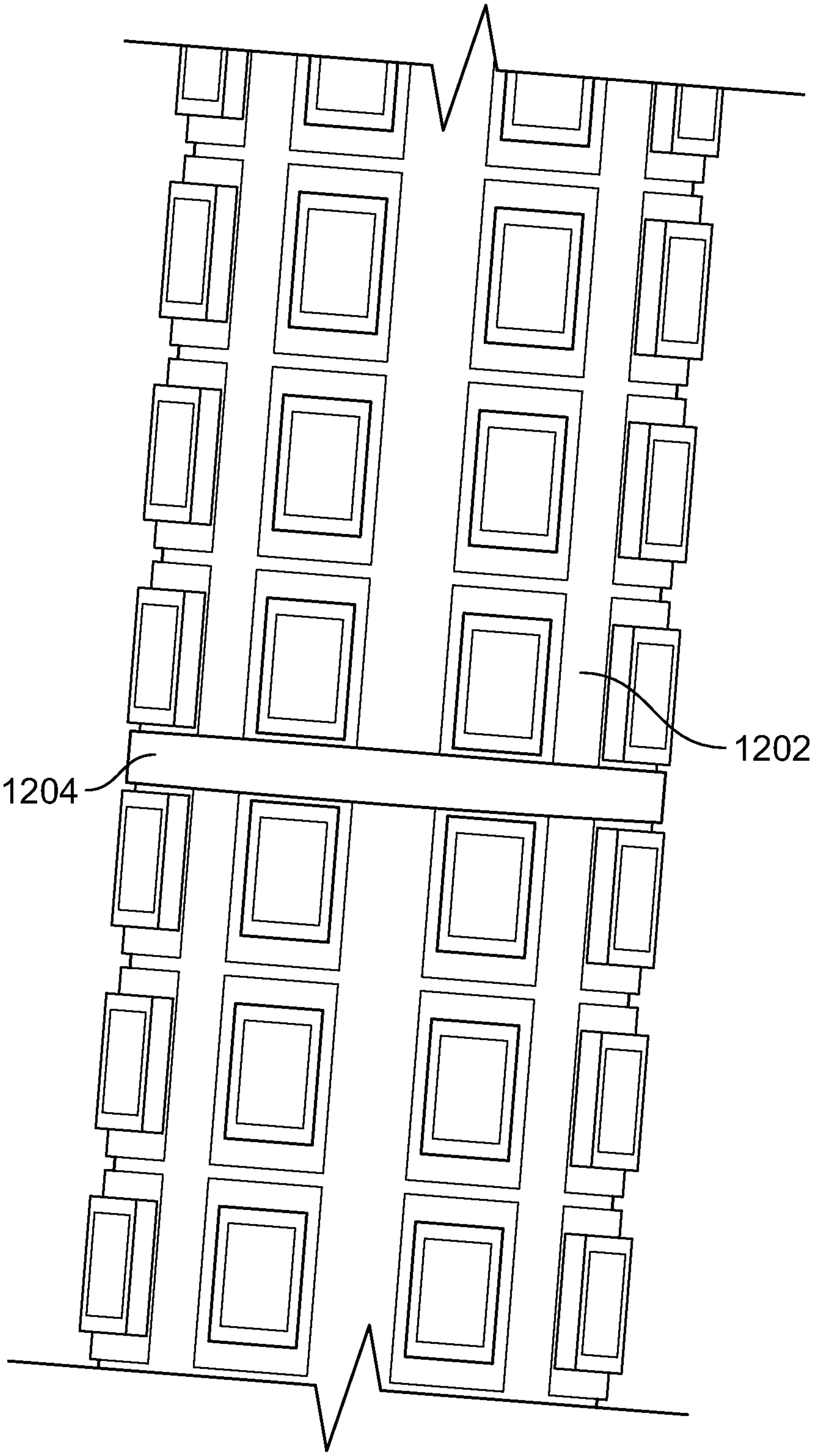
FIG. 12 shows apparatus in accordance with the principles of the invention.

FIG. 12 shows illustrative PCB 1202. PCB 1202 may be disposed in a jewel (not shown) such as one of the jewels $J_n$. The jewel may include poles such as poles 510 and 512. PCB 1202 may be disposed on the poles. The jewel may include band 1204. Band 1204 may retain PCB 1202 on the poles.

Figure 13:
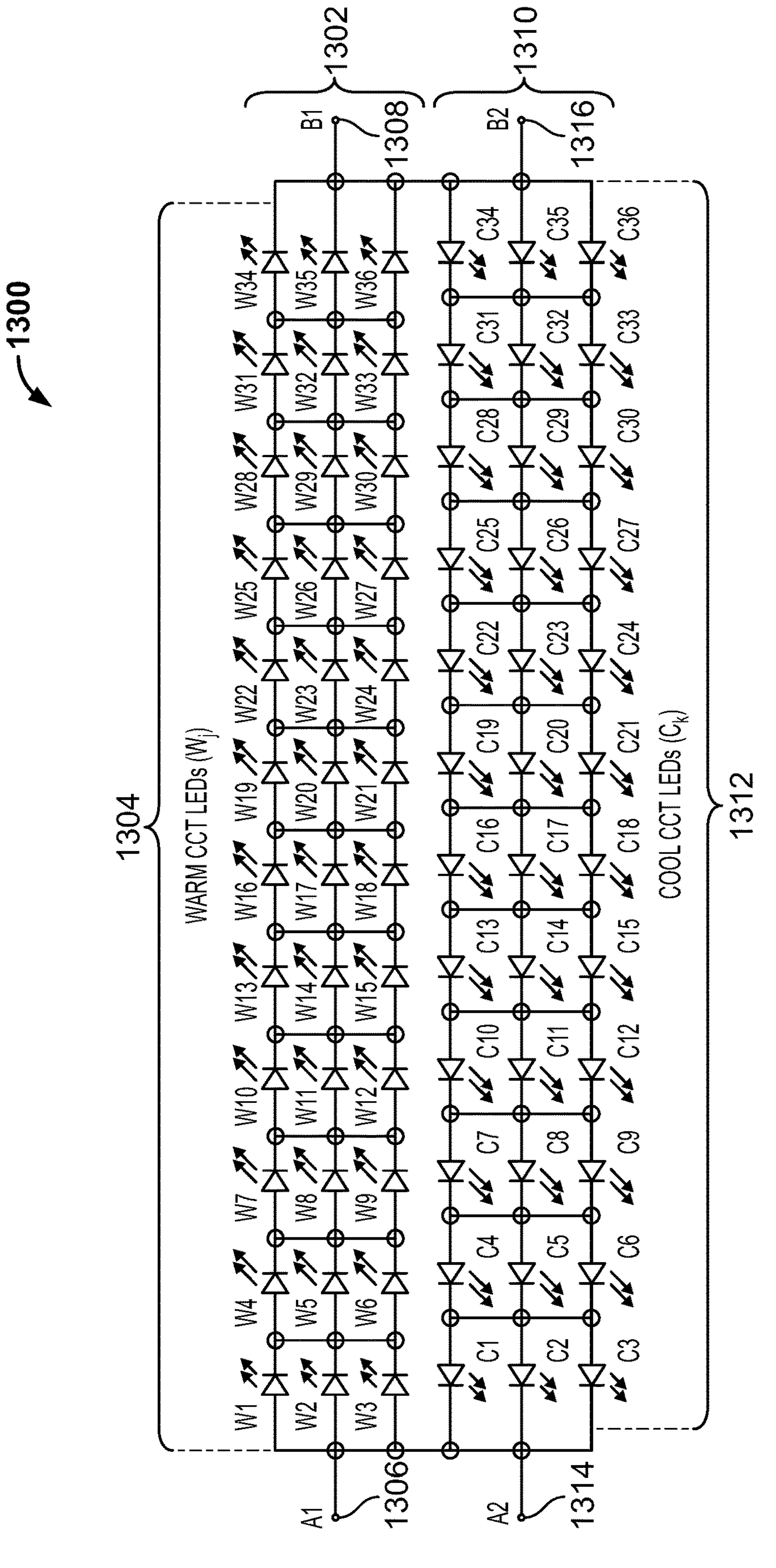
FIG. 13 shows apparatus in accordance with the principles of the invention.

FIG. 13 shows illustrative LED module circuit 1300. Circuit 1300 may be implemented on a PCB in a jewel such as one of jewels $J_n$. The PCB may have one or more features in common with one or more of PCBs 802, 1112 and 1202.

Circuit 1300 may include branch 1302. Branch 1302 may include one or more warm CCT LED group 1304 ($W_j$). Group 1304 may correspond to LED Group 1 (shown in FIG. 2). Branch 1302 may run from pole 1306 (A1) to pole 1308 (B1). Pole 1306 may correspond to pole A (shown in FIG. 2). Pole 1308 may correspond to pole B (shown in FIG. 2).

Circuit 1300 may include branch 1310. Branch 1310 may include one or more cool CCT LED group 1312 ($C_k$). Group 1312 may correspond to LED Group 2. Branch 1310 may run from pole 1314 (A2) to pole 1316 (B2). Pole 1314 may correspond to pole A (shown in FIG. 2). Pole 1316 may correspond to pole B (shown in FIG. 2).

Figure 14:
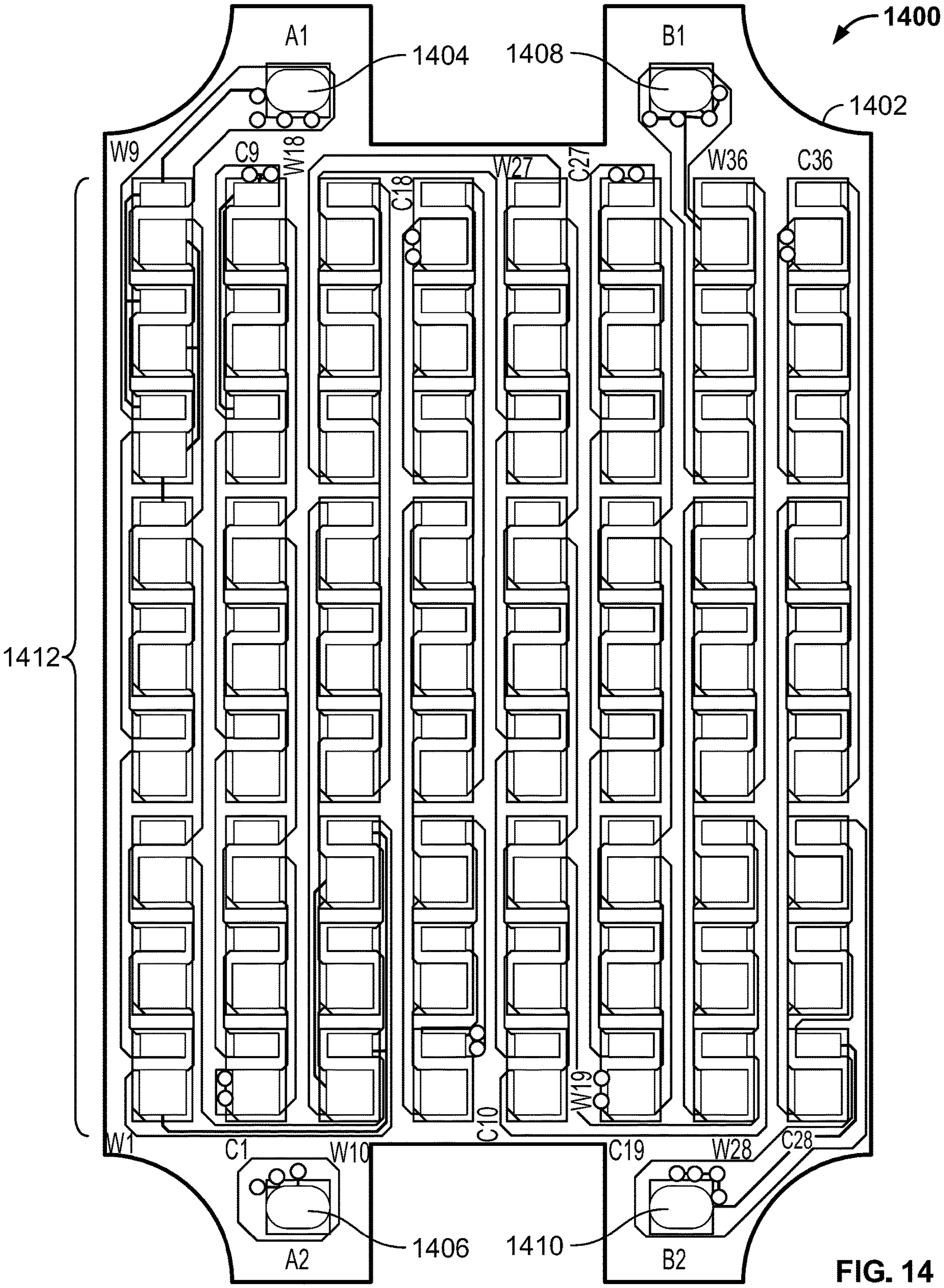
FIG. 14 shows apparatus in accordance with the principles of the invention.

FIG. 14 shows illustrative top layout 1400. Layout 1400 may be provided in a jewel such as one of jewels $J_n$. Layout 1400 may include PCB 1402. PCB 1402 may have one or more features in common with one or more of PCBs 802, 1112 and 1202. Layout 1400 may include pole 1404 (A1). Layout 1400 may include pole 1406 (A2). Poles 1404 (A1) and 1406 (A2) may correspond to pole A (shown in FIG. 2). Layout 1400 may include pole 1408 (B1). Layout 1400 may include pole 1410 (B2). Poles 1408 (A1) and 1410 (A2) may correspond to pole B (shown in FIG. 2).

Pole 1404 (A1) may correspond to pole 1306 (A1). Pole 1406 (A2) may correspond to pole 1314 (A2). Pole 1408 (B1) may correspond to pole 1308 (B1). Pole 1410 (B2) may correspond to pole 1316 (B2).

Layout 1400 may include LED group 1412. LED group 1412 may include LEDs such as LED group 1304 (W1-W36) and LED group 1312 (C1-C36).

Warm CCT LEDs Wj may extend from pole 1408

Figure 15:
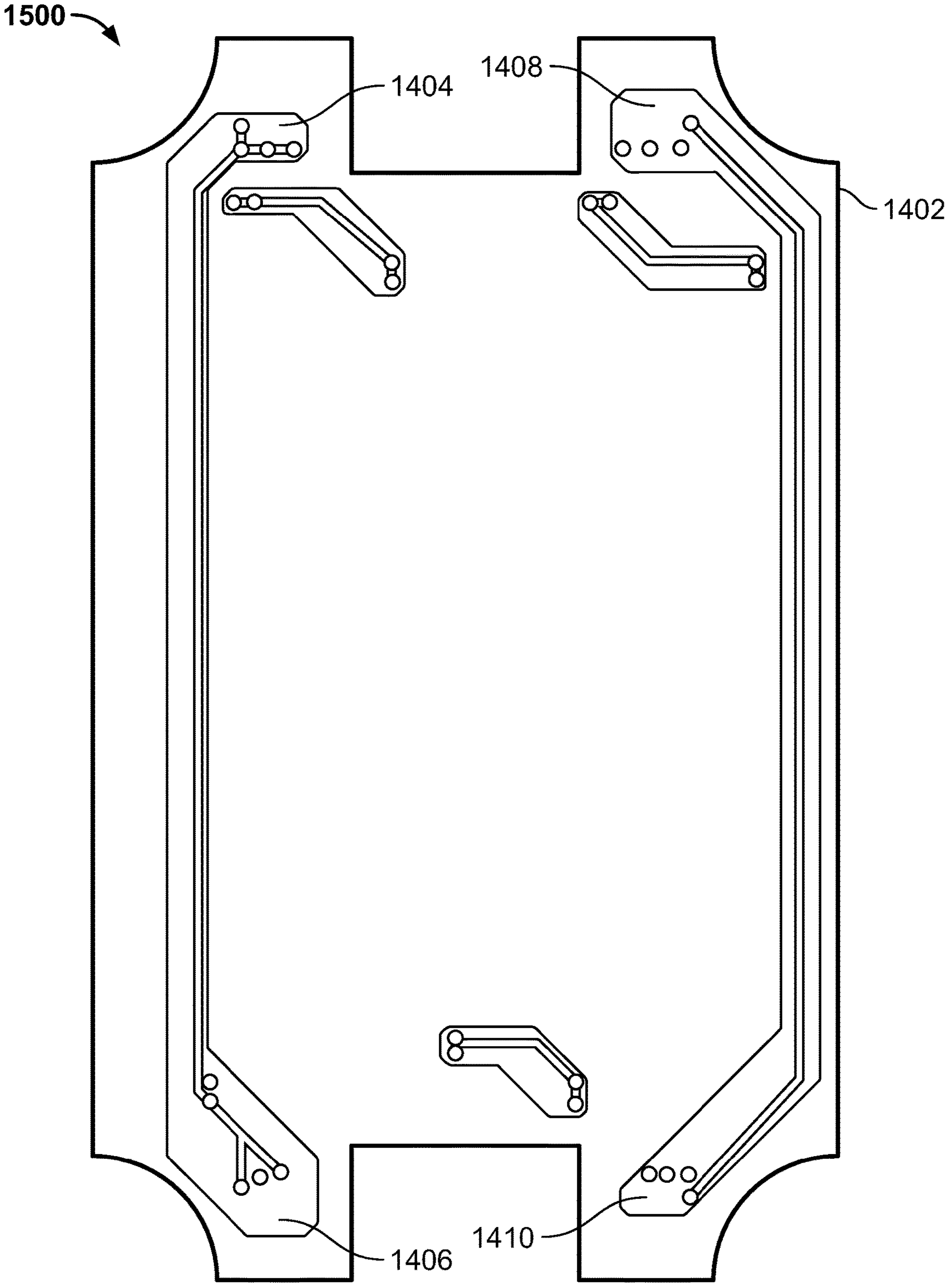
FIG. 15 shows apparatus in accordance with the principles of the invention.

FIG. 15 shows illustrative bottom layout 1500. Layout 1500 may be a bottom layout for PCB 1402.

Figure 16:
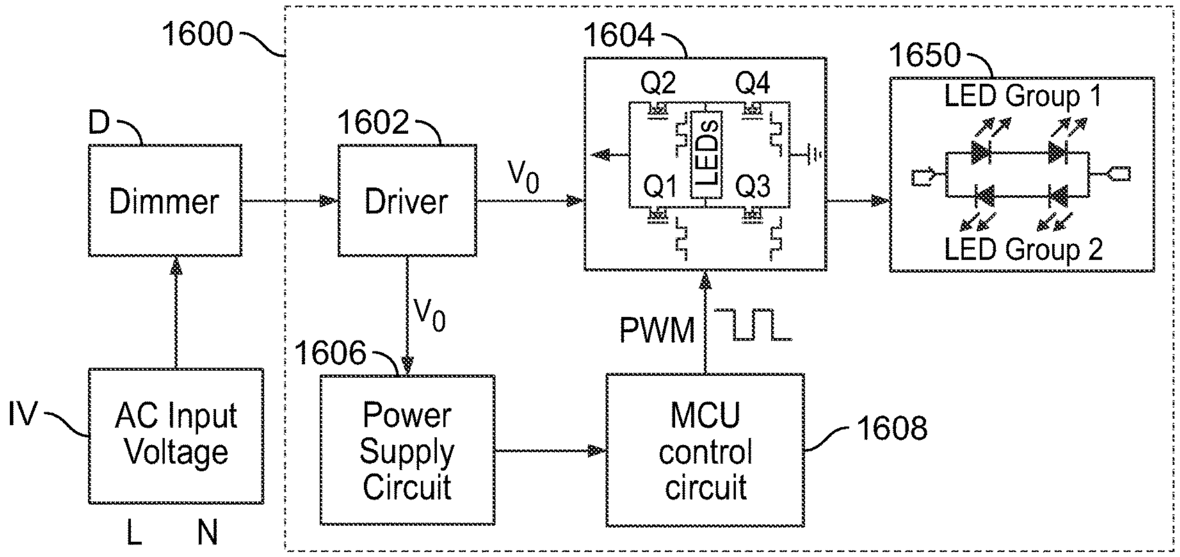
FIG. 16 shows apparatus in accordance with the principles of the invention.

FIG. 16 shows an illustrative logic diagram of color temperature regulating circuit 1600. The color temperature regulating circuit may have one or more features in common with architecture 200. One or more of the components represented in the diagram may be disposed in a fixture such as fixture 100. One or more of the components may be disposed in a canopy such as canopy 102. One or more of the components may be disposed in a jewel such as $J_n$.

Circuit 1600 may include driver 1602. Circuit 1600 may include color switching unit 1604. Circuit 1600 may include power supply circuit 1606. Circuit 1600 may include MCU control circuit 1608.

Circuit 1600 may receive a dimming signal from dimmer D. Dimmer D may include any suitable dimmer. Dimmer D may be a commercially available dimmer switch. Dimmer D may include a forward phase cut dimmer (e.g., magnetic low voltage ("MLV") or Triac). Dimmer D may include a reverse phase dimmer (e.g., electronic low voltage ("ELV")). Dimmer D may include a 0-10V dimmer. Dimmer D may be a wall-mounted dimmer switch.

AC power may enter dimmer D from L and N phase lines from standard AC Input Voltage IV.

Driver 1602 may be any suitable driver. Table 5 lists illustrative drivers for chains of different lengths. A fixture having one or more chains may have one or more drivers for each chain.

TABLE 5

Illustrative drivers (1602) for different chain lengths.
Illustrative drivers (1602) for different chain lengths

| Number of jewels (N) | Illustrative driver (1602), available from Dongguan AMC Lighting Co., Ltd., Dongguan City, China |
|---|---|
| 6 | 4LD0350U2238CP0350 |
| 8 | 4LD0500U2238DP0500 |
| 14 | 4LD0700U2240DP0700 |
| 18 | 4LD1050U2038AP1050 |
| 22 | 4LD1400U2036AP1400 |
| 40 | 2 * 4LD1050U2038AP1050 |
| Other suitable numbers | Other suitable drivers |

Driver 1602 may output voltage Vo. Vo may have a variable voltage. Vo may have a constant current. Driver 1602 may provide Vo to color switching unit 1604. Driver 1602 may provide Vo to microcontroller unit ("MCU") control circuit 1608. Color switching unit 1604 may include LED module 1650. Circuit 1608 may control the flow of current through LED group 1 and LED group 2 by controlling the states of MOSFETs Q1, Q2, Q3 and Q4 in color switching unit 1604.

Power supply circuit 1606 may provide a constant voltage to MCU control circuit 1608.

Figure 17:
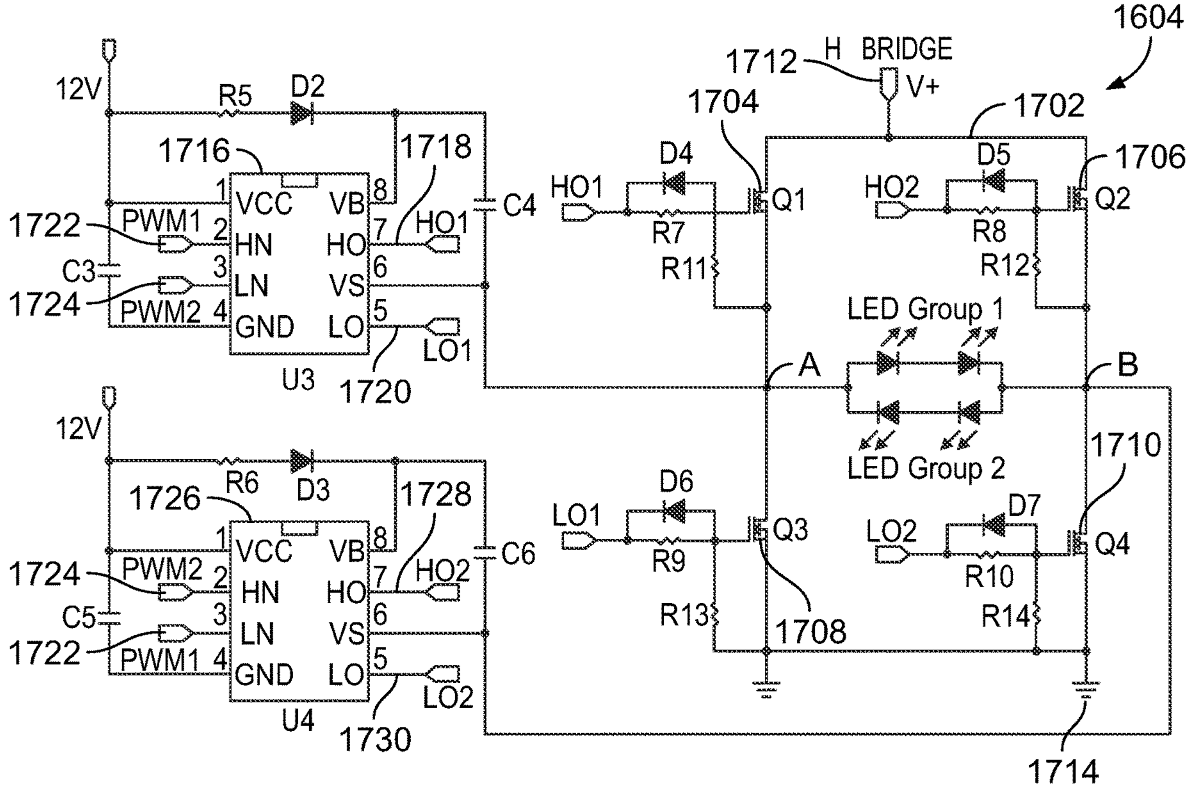
FIG. 17 shows apparatus in accordance with the principles of the invention.

FIG. 17 shows illustrative color switching unit 1604. Color switching unit 1604 may include H-bridge 1702. H-bridge 1702 may include MOSFET 1704 (Q1). H-bridge 1702 may include MOSFET 1706 (Q2). H-bridge 1702 may include MOSFET 1708 (Q3). H-bridge 1702 may include MOSFET 1710 (Q4). Voltage 1712 (V+), relative to ground 1714, may be applied to H-bridge 1702.

In a first state, MOSFETs 1704 (Q1) and 1710 (Q4) may be open (conducting) and MOSFETs 1706 (Q2) and 1708 (Q3) may be closed (non-conducting). In the first state, pole A may be HIGH and pole B may be LOW. Current may flow through LED group 1, which are aligned to conduct from pole A to pole B when pole A is HIGH, and not through LED group 2, which are aligned with polarity opposite LED group 1.

In a second state, MOSFETs 1706 (Q2) and 1708 (Q3) may be closed and MOSFETs 1704 (Q1) and 1710 (Q4) may be open. In the second state, pole B may be HIGH and pole A may be LOW. Current may flow through LED group 2, which are aligned to conduct from pole B to pole A when pole B is HIGH, and not through LED group 1, which are aligned with polarity opposite LED group 2.

In a third state, H-bridge 1702 may alternate between the first and second states. The alternation may have a duty cycle. The alternation may be based on fractions of the duty cycle.

The first, second and third states may correspond to positions of selector 206.

Circuit 1604 may include integrated circuit ("IC") 1716 (U3). IC 1716 (U3) may output PWM voltages 1718 (HO1) and 1720 (LO1), which may control, respectively MOSFETs 1704 (Q1) and 1708 (Q3). IC 1716 (U3) may receive signal 1722 (PWM1) and signal 1724 (PWM2). IC 1716 (U3) may receive signal 1722 (PWM1) at pin HN. IC 1716 (U3) may receive signal 1724 (PWM2) at pin LN.

Circuit 1604 may include integrated circuit ("IC") 1726 (U4). IC 1726 (U4) may output PWM voltages 1728 (HO2) and 1730 (LO2), which may control, respectively MOSFETs 1706 (Q2) and 1710 (Q4). IC 1726 (U4) may receive signal 1722 (PWM1) and signal 1724 (PWM2). IC 1716 (U3) may receive signal 1722 (PWM1) at pin LN. IC 1716 (U3) may receive signal 1724 (PWM2) at pin LH.

The sum of signals 1722 (PWM1) and 1724 (PWM2) may correspond to a dimming level set by dimmer D. The difference of signals 1722 (PWM1) and 1724 (PWM2) may correspond to a difference in intensity of light emission from LED group 1 and LED group 2. The difference may be based on an OFF condition in one of LED group 1 and LED group 2. The difference may be based on a difference of ON conditions between LED group 1 and LED group 2.

IC 1716 (U3) and IC 1726 (U4) may have similar or identical pin configurations. The inputs of signals 1722 (PWM1) and 1724 (PWM2) to IC 1726 (U4) pins HN and LN may be the reverse of the inputs of signals 1722 (PWM1) and 1724 (PWM2) to IC 1716 (U3) pins HN and LN. Current flow may be apportioned between LED group 1 and LED group 2.

Figure 18:
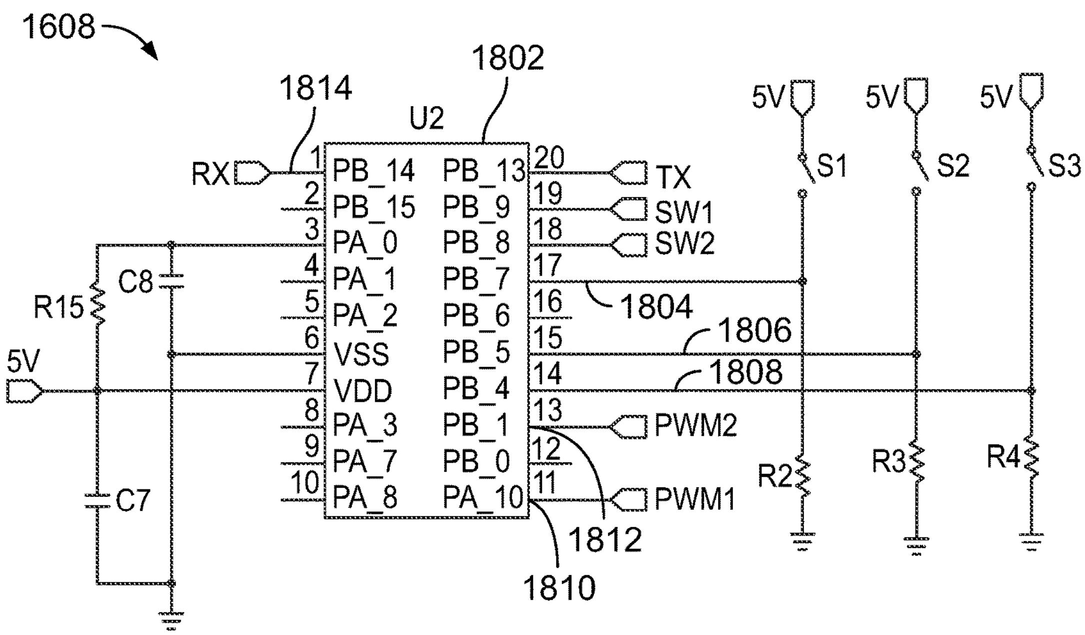
FIG. 18 shows apparatus in accordance with the principles of the invention.

FIG. 18 shows illustrative MCU control circuit 1608. Circuit 1608 may include MCU 1802 (U2). MCU 1802 (U2) may receive switch inputs 1804, 1806 and 1808, which may correspond to positions 1, 2 and 3 of selector 206. When selector 206 is at position 1, MCU 1802 (U2) may output a high duty cycle PWM signal at pin 1810 (PA_10; PWM1) and a low duty cycle PWM signal at pin 1812 (PB_1; PWM2). The low duty cycle PWM signal may correspond to an OFF condition in LED group 2. When selector 206 is at position 2, MCU 1802 (U2) may output a low duty cycle PWM signal at pin 1810 (PA_10; PWM1) and a high duty cycle PWM signal at pin 1812 (PB_1; PWM2). The low duty cycle PWM signal may correspond to an OFF condition in LED group 1. When selector 206 is at position 3, MCU 1802 (U2) may switch the high and low duty cycles between pin 1810 (PA_10; PWM1) and 1812 (PB_1; PWM2). The switch may be performed repeatedly at the switching cycle. This may cause alternating illumination between LED group 1 and LED group 2. The alternating illumination may provide illumination having a CCT that is a mix of the CCTs of LED group 1 and LED group 2.

Figure 19:
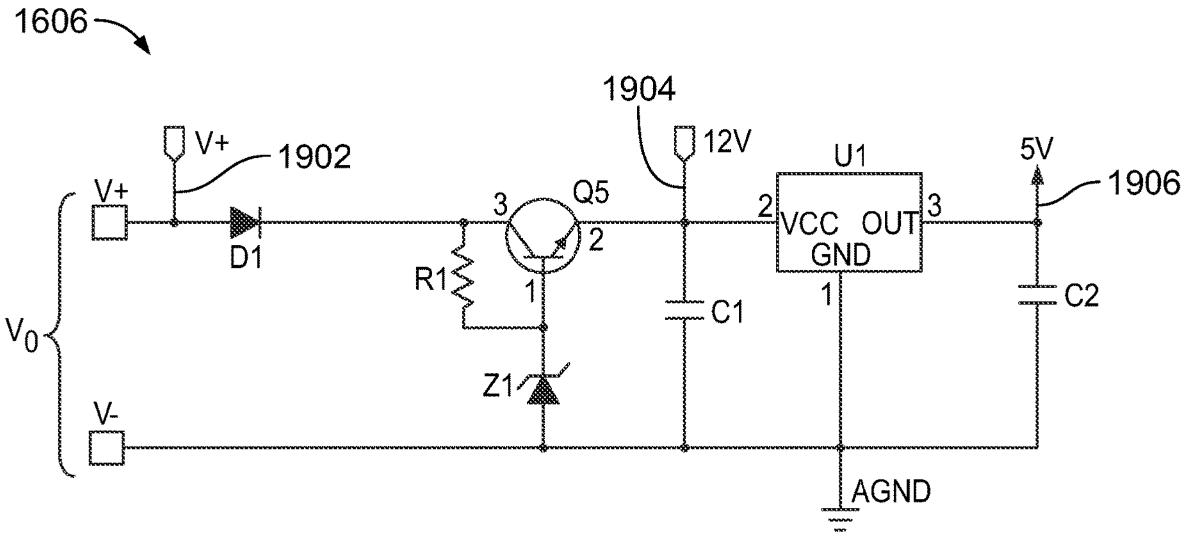
FIG. 19 shows apparatus in accordance with the principles of the invention.

FIG. 19 shows illustrative power supply circuit 1606. Circuit 1606 may receive voltage Vo. Circuit 1606 may provide voltage 1902 (V+), which is used by circuit 1604 to power LED group 1 and LED group 2. Circuit 1606 may provide voltage 1904 (12V), which may provide operational voltage for ICs 1716 (U3) and 1726 (U4). Circuit 1606 may provide constant voltage 1906 (5V), which may provide operational voltage for MCU 1802 (U2).

Circuit 1608 may receive external control signal 1814 (Rx). Signal may be processed by the MCU U2 to obtain signals PWM1 and PWM2.

By controlling the turn-on time of the MOS Q1/Q4 and Q2/Q3, the brightness of the LED light sources of LED group 1 and LED group 2 can be adjusted, so as to realize the adjustment of the color temperature of LED light source.

Table 6 lists illustrative parts that may be associated with one or more circuits.

TABLE 6

Illustratice parts that may be associated with one or more circuits.

| Illustrative part | Tag |
|---|---|
| PCB 52 mm*26 mm | |
| SMD Schottky Barrier Diode 5 A/60 V, SS56, SMA | D1 |
| Fast recovery diode ES1JW 1 A/600 V SOD-123FL | D2, D3 |
| SMD switching diode 1N4148W, 0.15 A/75 V, SOD-123 | D4, D5, D6, D7 |
| SMD zener diode 12 V ± 2%/MM1ZB12 0.5 W SOD-123 | Z1 |
| X7R MLCC 1 uF/50 V, ±10%, 125° C.(0805) | C1, C3, C5, C7 |
| X7R MLCC 1 nF/50 V, ±10%, 125° C.(0805) | C9, C10, C11 |
| X7R MLCC 100 nF/50 V, ±10%, 125° C.(0805) | C4, C6 |
| X7R MLCC 100 NF/50 V, ±10%, 125° C.(0603) | C8 |
| 1/4 W SMD resistor, 20K ± 5%(0805) | R1, R2, R3, R4 |
| 1/8 W SMD resistor, 3.3Ω ± 1%(0805) | R5, R6 |
| 1/4 W SMD resistor, 47K ± 1%(0805) | R11, R12, R13, R14 |
| 1/8 W SMD resistor, 5.1Ω ± 1%(0805) | R7, R8, R9, R10 |
| 1/8 W SMD resistor, 1K ± 1%(0805) | R16 |
| 1/10 W SMD resistor, 1K ± 1%(0603) | R15 |
| SMD voltage regulator IC, LD1117A, 3.3V, SOT-89 (available from Unisonic Technologies Co., Ltd (www.unisonic.com.tw)) | U1 |
| SMD IC ME32S003AF6P7 SS0P-20 RoHS (www.mesilicon.com) | U2 |
| SMD IC ID2006 SOP-8 RoHS (Idriver) | U3, U4 |
| SMD N-MOSFET 15N10, TO-252 | Q1, Q2, Q3, Q4 |
| SMD NPN 2SD1760U_SOT-89_60V/3A | Q5 |
| FPC 38.6 mm*60 mm | |
| Hoyol 2835W6J-K-RA90 (G12-3HM) 3090 3STEP | W1-W36 |
| Hoyol 2835W4J-K-RA90 (D28-3HM) 4090 3STEP | C1-C36 |
| Other illustrative parts | |

Figure 20:
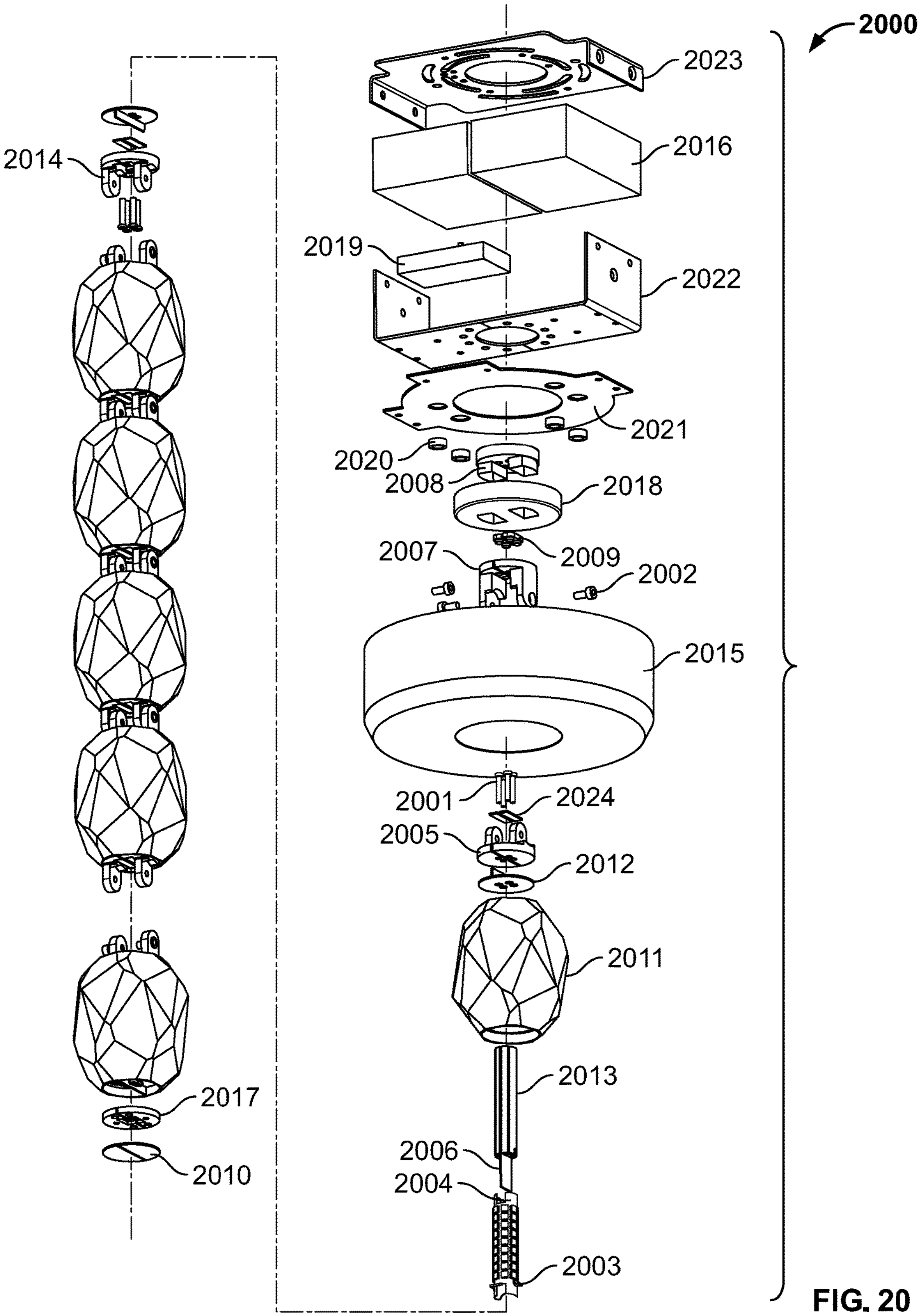
FIG. 20 shows apparatus in accordance with the principles of the invention.

FIG. 20 shows illustrative fixture 2000. Fixture 2000 may have one or more features in common with fixture 100. Table 7 lists illustrative parts that may be associated with a fixture.

TABLE 7

Illustrative parts that may be associated with a fixture.

| Illustrative part | Tag |
|---|---|
| φ6 pan head Phillips stainless steel screw 1/8"-40 full length 16 | 2001 |
| φ6.7 hexagonal socket stainless steel screw | 2002 |
| 22 AWG white wire with φ4.5 terminal | 2003 |
| 56 mm 12S6P*2 30-40 2835 LED SMD component | 2004 |
| Connector | 2005 |
| Heat sink double-sided tape | 2006 |
| Bracket | 2007 |
| Top gasket | 2008 |
| Screw gasket | 2009 |
| Bottom decorative plate | 2010 |
| Crystal glued on assembly | 2011 |
| Connector insulating gasket | 2012 |
| Heat Sink | 2013 |
| Connector | 2014 |
| Canopy | 2015 |
| 120-277 V 13 W 350 mA LED square driver | 2016 |
| Conversion connector | 2017 |
| Top decorative block | 2018 |
| Color temperature controller | 2019 |
| Magnet | 2020 |
| Fixed disc | 2021 |
| Driver affixed plate | 2022 |
| Backplate | 2023 |
| Connector decorative cover | 2024 |
| φ7.5 round head Phillips stainless steel screw #8-32, tooth length 15 | |
| Transparent cable bundle, 100 mm long | |
| Other illustrative parts. | |

Figure 21:
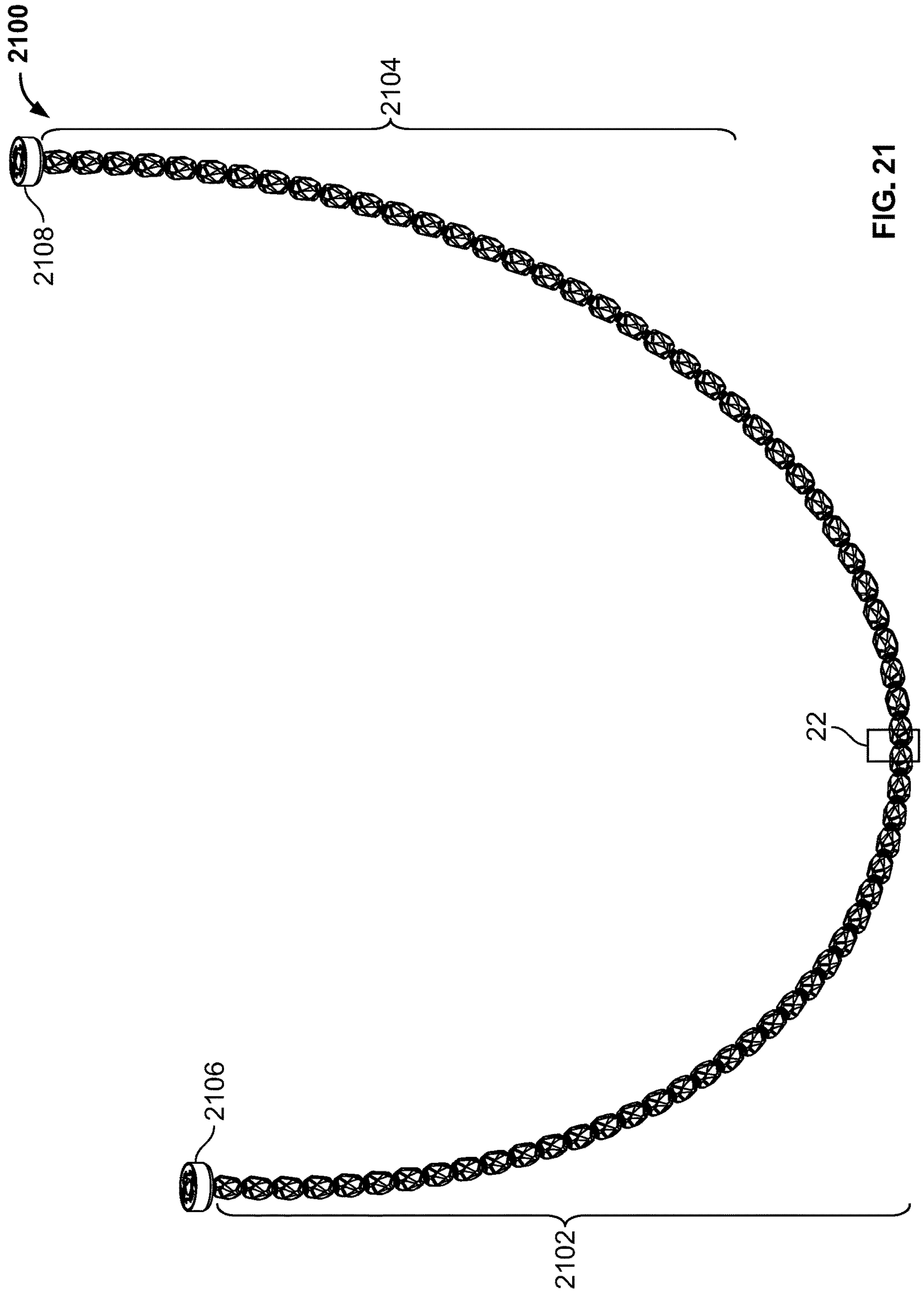
FIG. 21 shows apparatus in accordance with the principles of the invention.

FIG. 21 shows illustrative fixture 2100. Fixture 2100 may have one or more features in common with one or more of fixtures 100 and 2000. Fixture 2100 may include jewel chain 2102. Fixture 2100 may include jewel chain 2104. Fixture 2100 may include canopy 2106. Fixture 2100 may include canopy 2108. Chain 2102 may be suspended from canopy 2108. Chain 2104 may be suspended from canopy 2106.

Fixture 2100 may include a first LED driver circuit (not shown). The first LED driver circuit may provide power to LEDs in chain 2102. Fixture 2100 may include a second LED driver circuit (not shown). The second LED driver circuit may provide power to LEDs in chain 2102. The LEDs in chain 2104 may be electrically isolated from the first LED driver circuit. The LEDs in chain 2102 may electrically isolated from the second LED driver circuit. The first LED driver circuit may be disposed in canopy 2106. The second LED driver circuit may be disposed is canopy 2108.

Circuits for illuminating chain 2106 may be the same or similar to the circuits provided for chain 104. Circuits for illuminating chain 2108 may be the same or similar to the circuits provided for chain 104.

Figure 22:
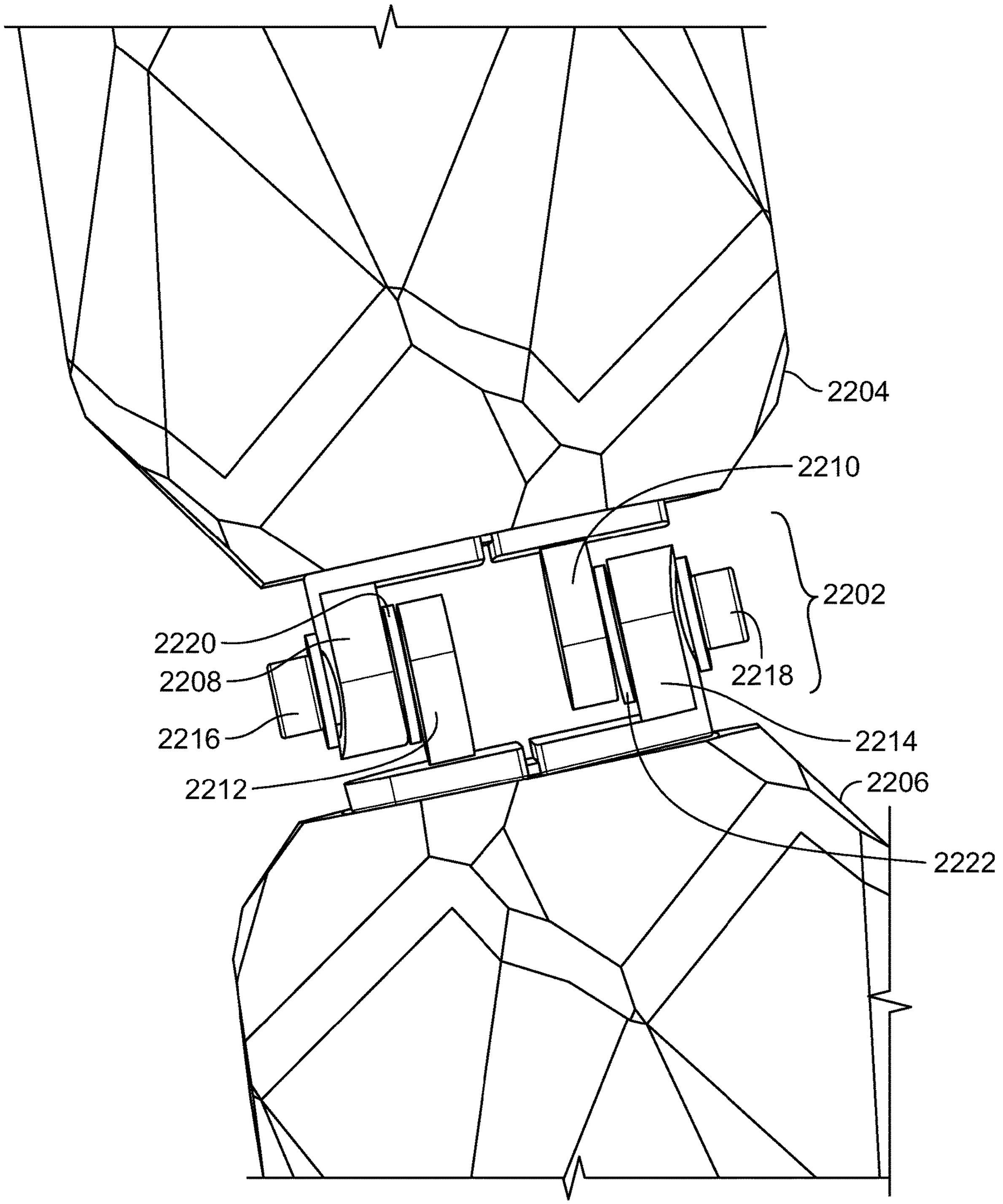
FIG. 22 shows apparatus in accordance with the principles of the invention.

FIG. 22 shows illustrative link 2202 that may be included in fixture 2100 to link between chain 2102 and 2104. Link 2202 may be formed between jewel 2204 and jewel 2206. Jewel 2204 may have one or more features in common with one of jewels $J_n$. Jewel 2206 may have one or more features in common with one of jewels Jn.

Jewel 2204 may include extension 2208. Jewel 2204 may include extension 2210. Jewel 2206 may include extension 2212. Jewel 2204 may include extension 2214.

Extension 2208 may be in electrical continuity through a first branch through jewel 2204 to circuitry in canopy 2106. Extension 2210 may be in electrical continuity through a second branch through jewel 2204 to circuitry in canopy 2106. The first and second branches may be maintained at different voltages from each other for operation of LEDs arranged between the first and second branches.

Extension 2212 may be in electrical continuity through a third branch through jewel 2206 to circuitry in canopy 2108. Extension 2214 may be in electrical continuity through a fourth branch through jewel 2206 to circuitry in canopy 2108. The third and fourth branches may be maintained at different voltages from each other for operation of LEDs arranged between the third and fourth branches.

Link 2202 may include pivot 2216. Link 2202 may include pivot 2218. Link 2202 may include washer 2220. Link 2202 may include washer 2222. Pivot 2216 and pivot 2218 may provide mechanical linkage between jewel 2204 and jewel 2206. Link 2202 may include washer 2220. Link 2202 may include washer 2222. Pivots 2216 and 2218 and washers 2220 and 2222 may include non-conducting material. The non-conducting material may include a dielectric, polymer or other suitable non-conducting material. The first and third branches may thus be electrically isolated from each other. The second and fourth branches may thus be electrically isolated from each other. Chain 2102 and chain 2104 may thus be electrically isolated from each other.

All ranges and parameters disclosed herein shall be understood to encompass any and all subranges subsumed therein, every number between the endpoints, and the endpoints. For example, a stated range of "1 to 10" should be considered to include any and all subranges between (and inclusive of) the minimum value of 1 and the maximum value of 10; that is, all subranges beginning with a minimum value of 1 or more (e.g. 1 to 6.1), and ending with a maximum value of 10 or less (e.g., 2.3 to 10.4, 3 to 8, 4 to 7), and finally to each number 1, 2, 3, 4, 5, 6, 7, 8, 10, and 10 contained within the range.

Thus, apparatus and methods for LED lighting have been provided. Persons skilled in the art will appreciate that the present invention can be practiced by other than the described examples, which are presented for purposes of illustration rather than of limitation. The present invention is limited only by the claims that follow.

What is claimed is:

1. Apparatus for lighting, the apparatus comprising:
a first jewel; and
a second jewel that is supported by the first jewel by:
a first link that is configured to provide current between the first jewel and the second jewel; and
a second link that is configured to provide current between the first jewel and the second jewel;
wherein:
the first and second links are the only attachments of the second jewel to the first jewel;
the second jewel is configured to selectively emit three different colors of light; and
at least one of the first and second jewels include:
a color-1 LED string that is configured to conduct current only from the first link to the second link; and
a color-2 LED string that is configured to conduct current only from the second link to the first link.

2. The apparatus of claim 1 wherein the first and second links are the only electrical conductors between the first and second jewels.

3. The apparatus of claim 1 wherein:
the first link is configured to have a first voltage, the first voltage corresponding to a first driver pole; and
the second link is configured to have a second voltage, the second voltage corresponding to a second driver pole.

4. The apparatus of claim 3 wherein:
the color-1 LED string is configured to emit a first of the three colors; and
the color-2 LED string is configured to emit a second of the three colors.

5. The apparatus of claim 4 wherein the color-1 string and the color-2 string are disposed in the second jewel.

6. The apparatus of claim 1 wherein:
the first jewel includes:
the color-1 LED string; and
the color-2 LED string.

7. The apparatus of claim 1 wherein:
a first of the three colors is of a first correlated color temperature ("CCT");
a second of the three colors is of a second CCT; and
a third of the three colors is of a third CCT.

8. The apparatus of claim 1 further including a user-operable switch that is configured for selection of one of the three colors.

9. The apparatus of claim 1 wherein the first jewel is configured to emit the three colors of light.

10. The apparatus of claim 2 further comprising:
a third jewel that is supported by the second jewel by:
a third link that is configured to provide current from the second jewel to the third jewel; and
a fourth link that is configured to provide current from the third jewel to the second jewel;
wherein:
the third and fourth links are the only attachments of the third jewel to the second jewel; and
the third jewel is configured to emit the three colors.

11. The apparatus of claim 1 further comprising a microcontroller that is configured to distribute current between the first link and the second link.

12. The apparatus of claim 11 further comprising a transistor bridge that adjusts current flow through the first and second links in conformance with signals from the microcontroller.

13. The apparatus of claim 11 further including a canopy that is configured to be fixed to a ceiling.

14. The apparatus of claim 13 wherein the microcontroller and a transistor bridge are disposed in the canopy.

15. The apparatus of claim 14 further comprising a user-operable switch that is configured for selection of one of the three colors;

wherein the switch is disposed in the canopy and is in communication with the microcontroller.

16. The apparatus of claim 3 wherein a microcontroller is configured to provide positive voltage to the:

first pole to energize the color-1 LED strings; and second pole to energize the color-2 LED strings.

17. The apparatus of claim 16 wherein:

a first color of the three colors is a high CCT;

a third color of the three colors is a low CCT; and a second color of the three colors is a mixture of the high CCT and the low CCT.

18. The apparatus of claim 17 wherein the microcontroller is configured to alternately energize the color-1 and color-2 LED strings to produce the third of the three colors.

19. Apparatus for lighting, the apparatus comprising:

a first jewel including a first LED light source;

a second jewel including a second LED light source;

a first LED light source control circuit; and a second LED light source control circuit;

wherein:

the first jewel is configured to be mechanically and electrically linked to a first jewel chain that is configured to be powered by the first LED light source control unit;

the second jewel is configured to be mechanically and electrically linked to a second jewel chain that is configured to be powered by the second LED light source control unit;

the second jewel is configured to be mechanically linked to and electrically isolated from the first jewel;

both the first and the second jewel are configured to selectively emit three different colors of light; and wherein at least one of the first and second LED light sources include:

a color-1 LED string that is configured to conduct current only from the first link to the second link; and a color-2 LED string that is configured to conduct current only from the second link to the first link.

* * * * *